US012740042B2

(12) United States Patent
Fan

(10) Patent No.: US 12,740,042 B2
(45) Date of Patent: Sep. 15, 2026

(54) METHOD FOR PREPARING AIR GAP BETWEEN BIT LINE STRICTURE AND CAPACITOR CONTACT

(71) Applicant: NANYA TECHNOLOGY CORPORATION, New Taipei City (TW)

(72) Inventor: Cheng-Hsiang Fan, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 440 days.

(21) Appl. No.: 18/518,545

(22) Filed: Nov. 23, 2023

(65) Prior Publication Data

US 2025/0176168 A1 May 29, 2025

(51) Int. Cl.

*H10B 12/00* (2023.01)
*H10W 20/00* (2026.01)
*H10W 20/43* (2026.01)
*H10W 20/46* (2026.01)

(52) U.S. Cl.

CPC ....... *H10B 12/0335* (2023.02); *H10B 12/482* (2023.02); *H10W 20/072* (2026.01); *H10W 20/43* (2026.01); *H10W 20/46* (2026.01)

(58) Field of Classification Search

CPC ......................... H10B 12/0335; H10B 12/482; H10B 12/315; H10B 12/485; H10B 12/03; H10B 12/01; H10W 20/072; H10W 20/43; H10W 20/46; H10W 10/021; H10W 10/20

See application file for complete search history.

(56) References Cited

U.S. PATENT DOCUMENTS 9,653,347 B1 5/2017 Leobandung
2003/0197212 A1* 10/2003 Kutsunai ................ H10D 1/682 257/295
2014/0131700 A1 5/2014 Yamazaki (Continued)

FOREIGN PATENT DOCUMENTS

CN 220041870 U 11/2023
TW 201413969 A 4/2014

(Continued)

OTHER PUBLICATIONS

Office Action and and the search report mailed on Jan. 9, 2025 related to Taiwanese Application No. 113103987.

(Continued)

*Primary Examiner* — John P. Dulka
(74) *Attorney, Agent, or Firm* — Xuan Zhang

(57) ABSTRACT

The present disclosure provides a semiconductor device with an air gap between a bit line structure and capacitor contact and also provides a method for preparing the same. The method includes defining an active region in a substrate, forming a bit line structure and capacitor contact disposed over and electrically connected to the active region, forming a first spacer structure sandwiched between the bit line structure and the capacitor contact, and forming a second spacer structure disposed over the first spacer structure. The first spacer structure includes an air gap structure and the air gap structure is covered by the second spacer structure.

15 Claims, 28 Drawing Sheets

(56) References Cited

U.S. PATENT DOCUMENTS

| | | | | |
|---|---|---|---|---|
| 2015/0126013 | A1 | 5/2015 | Hwang et al. | |
| 2015/0155392 | A1 | 6/2015 | Yamazaki | |
| 2017/0236848 | A1 | 8/2017 | Yamazaki | |
| 2020/0066729 | A1 | 2/2020 | Simsek-Ege et al. | |
| 2020/0203354 | A1 | 6/2020 | Lee et al. | |
| 2022/0262802 | A1* | 8/2022 | Fan | H10B 12/0335 |
| 2023/0369462 | A1* | 11/2023 | Sun | H10D 84/0151 |

FOREIGN PATENT DOCUMENTS

| | | | |
|---|---|---|---|
| TW | 201426907 | A | 7/2014 |
| TW | 201535813 | A | 9/2015 |
| TW | 202133328 | A | 9/2021 |
| TW | 202230843 | A | 8/2022 |
| TW | 202234577 | A | 9/2022 |
| TW | 202234662 | A | 9/2022 |
| TW | 202314572 | A | 4/2023 |
| TW | 202329399 | A | 7/2023 |
| TW | 202339232 | A | 10/2023 |

OTHER PUBLICATIONS

Summary translation of Office Action and and the search report mailed on Jan. 9, 2025 related to Taiwanese Application No. 113103987.

Office Action and and the search report mailed on Jun. 4, 2025 related to Taiwanese Application No. 113120987.

Summary translation of Office Action and and the search report mailed on Jun. 4, 2025 related to Taiwanese Application No. 113120987.

Office Action and and the search report mailed on Feb. 5, 2026 related to U.S. Appl. No. 18/538,103.

Office Action and and the search report mailed on Apr. 24, 2026 related to U.S. Appl. No. 18/538,103.

* cited by examiner

101/109/141
107
143
149
121/119
115c
A'
A 100b
153
149
121
117'
115'
119
211B
211C
213
109
143
105b
105a
115c
101
103
151

METHOD FOR PREPARING AIR GAP BETWEEN BIT LINE STRICTURE AND CAPACITOR CONTACT

TECHNICAL FIELD

The present disclosure relates to a semiconductor device and method for preparing the same, and more particularly, to a method for preparing a semiconductor device with an air gap between bit line structure and capacitor contact.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, distinct types and dimensions of semiconductor devices providing different functionalities are integrated and packaged into a single module. Furthermore, numerous manufacturing operations are implemented for integration of distinct types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as short circuit and leakage current between neighboring conductive features. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for forming a semiconductor device is provided. The method includes defining a plurality of active regions by forming a device isolation layer in a substrate, forming a semiconductor layer and a metal layer on the active regions, forming a first mask intersecting the active regions on the metal layer, forming a plurality of bit line structures by etching the semiconductor layer and the metal layer using the first mask as etch mask, forming a plurality of lower spacer structures with an energy removable material, forming a second mask over the metal layer; forming a plurality of first spacer structures by forming a plurality of upper spacer structures with each of the upper spacer structures is disposed over the corresponding lower spacer structure; forming a dielectric layer surrounding the upper spacer structures and covering the metal layer, forming a plurality of capacitor contacts by forming a barrier layer and a conductor layer within each of the plurality of capacitor contacts, performing an etch-back process on the barrier layer and the conductor layer, and performing a thermal treating process to transform the plurality of first spacer structures into a plurality of air gap structures.

In an embodiment, forming the lower spacer structures with an energy removable material comprising depositing the energy removable material over the metal layer; and planarizing the energy removable material until the metal layer is exposed.

In an embodiment, forming the upper spacer structures comprising conformally depositing the energy removable material overlying the first mask and the metal layer; and etching the energy removable material by an anisotropic etching process.

In an embodiment, forming the dielectric layer surrounding the upper spacer structures and covering the metal layer comprising depositing a dielectric material overlying and covering the upper spacer structures; and planarizing the dielectric material until the first mask is exposed.

In an embodiment, the barrier layers is formed by an anisotropic deposition process.

In an embodiment, the conductive layers is formed by a deposition process.

In an embodiment, further comprising forming the barrier layer having a first thickness on the sidewall of the corresponding conductive layer and having a second thickness under the bottom surface of the corresponding conductive layer.

In an embodiment, performing a thermal treating process to transform the plurality of first spacer structures into a plurality of air gap structures further comprising forming an air gap enclosed by a liner within each of the air gap structures.

In another embodiment of the present disclosure, a method for manufacturing a semiconductor device comprising: forming a first source/drain region and a second source/drain region disposed in a semiconductor substrate; forming a bit line structure disposed over and electrically connected to the first source/drain region; forming a capacitor contact disposed over and electrically connected to the second source/drain region; forming a first spacer structure sandwiched between the bit line structure and the capacitor contact, wherein the first spacer structure comprises an air gap; and forming a second spacer structure disposed over the first spacer structure, wherein the air gap is covered by the second spacer structure.

In an embodiment, the formation of the bit line structure comprising forming a semiconductor layer over the semiconductor substrate; forming a metal layer over the semiconductor layer, and performing an etching process on the semiconductor layer and the metal layer.

In an embodiment, further forming a patterned mask over the bit line structure.

In an embodiment, further forming a dielectric layer over the second spacer structures and the patterned mask.

In an embodiment, further forming a conductive pad covering the second spacer structure and extend to cover portions of the patterned mask.

In an embodiment, the conductive pad is disposed over and electrically connected to the capacitor contact.

In an embodiment, further performing a thermal treating process to transform the first spacer structures into an air gap structure, wherein the air gap structure including the air gap enclosed by a liner.

In an embodiment, the air gap structure of the first spacer structure and the air gap extends into the semiconductor substrate.

In an embodiment, the capacitor contact comprising a barrier layer and a conductive layer ling the barrier layer.

In an embodiment, the barrier layer having a first thickness on the sidewall of the corresponding conductive layer and a second thickness under the bottom surface of the corresponding conductive layer.

In yet another embodiment of the present disclosure, a semiconductor device is provided The semiconductor device comprises a first source/drain region and a second source/drain region disposed in a semiconductor substrate; a bit line structure disposed over and electrically connected to the first source/drain region; a capacitor contact comprising a barrier layer and a conductive layer; a first spacer structure sandwiched between the bit line structure and the capacitor contact, wherein the first spacer structure comprises an air gap; and a second spacer structure disposed over the first spacer structure, wherein the air gap is covered by the second spacer structure.

In an embodiment, the first spacer structure comprises an air gap structure contacting the bit line structure.

In an embodiment, the air gap structure include an air gap enclosed by a liner.

In an embodiment, the air gap of the first spacer structure extends into the semiconductor substrate.

In an embodiment, further comprising a patterned mask disposed over the bit line structure.

In an embodiment, further comprising a conductive pad disposed over and electrically connected to the capacitor contact, wherein the conductive pad extends over the second spacer structure and the patterned mask.

In an embodiment, the bit line structure comprises a semiconductor layer over the semiconductor substrate and a metal layer over the semiconductor layer.

In an embodiment, the barrier layer conductive layer has a first thickness on the sidewall of the corresponding conductive layer and a second thickness under the bottom surface of the corresponding conductive layer.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for conducting the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
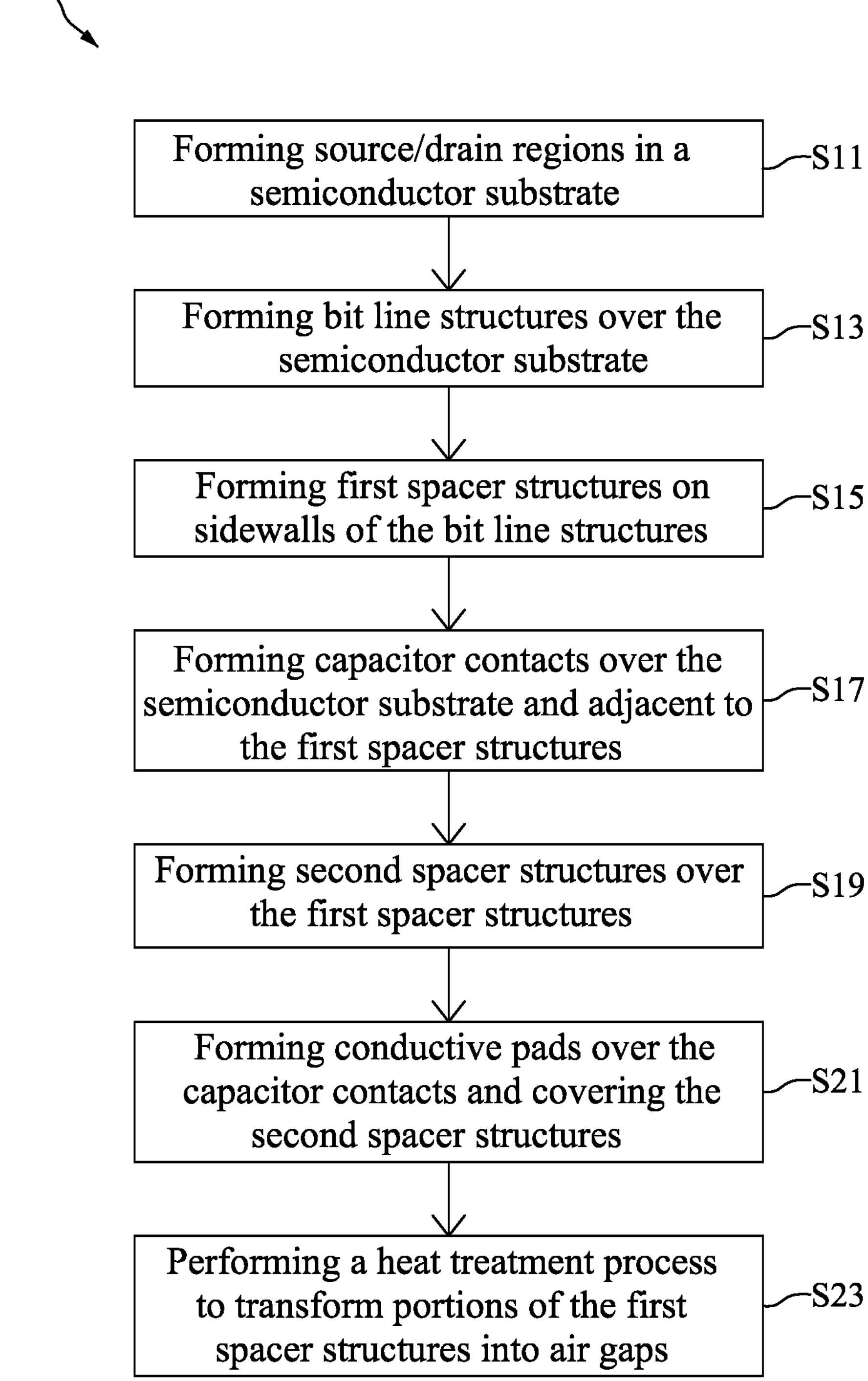
FIG. 1 is a flow diagram illustrating a method for forming a semiconductor device, in accordance with some embodiments.

The following disclosure provides many different embodiments, or examples, for implementing distinctive features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the numerous examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 18:
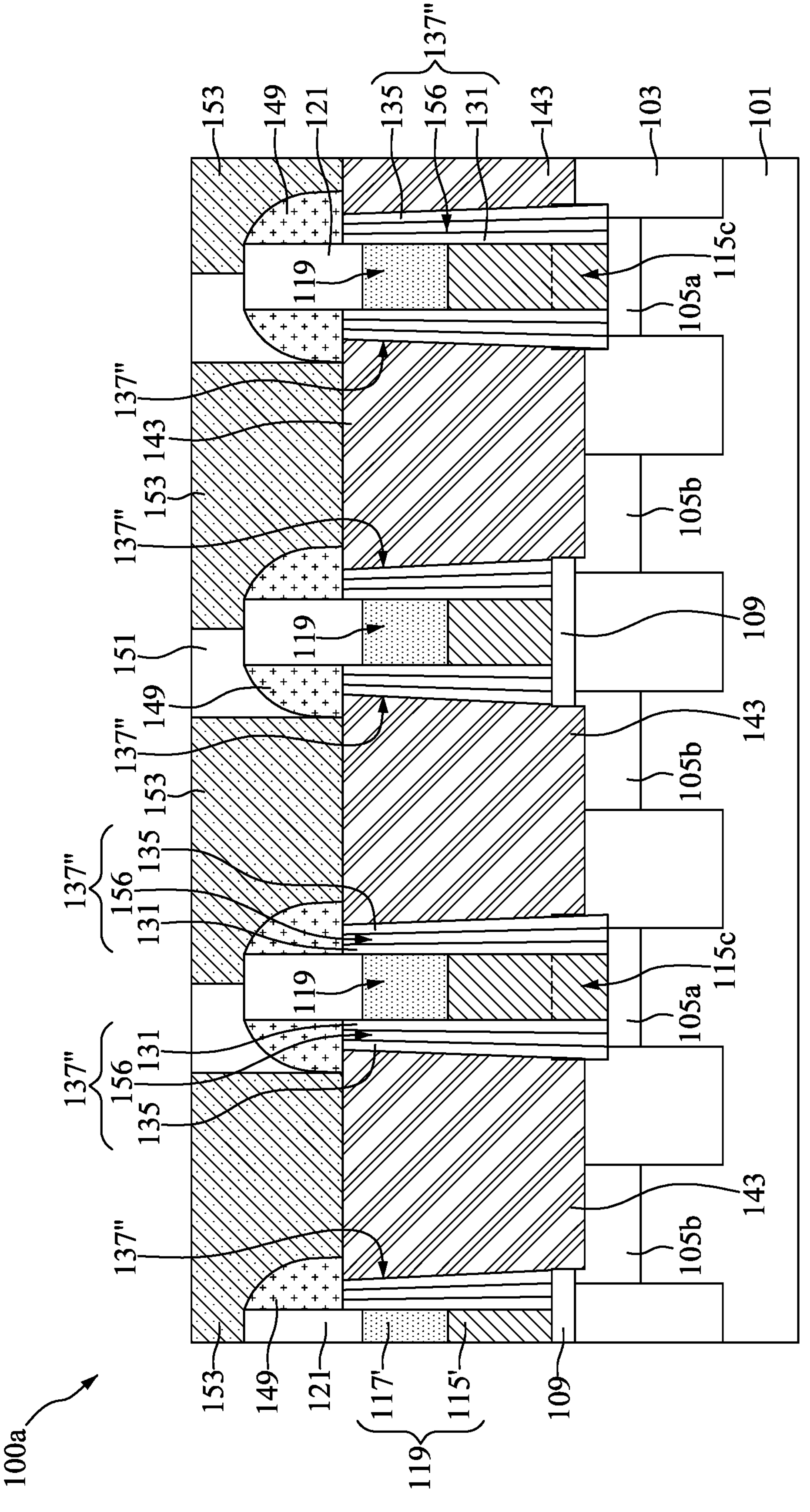
FIG. 18 is a cross-sectional view illustrating an intermediate stage of transforming portions of the first spacer structures into air gaps during the formation of the semiconductor device, in accordance with some embodiments.
Figure 19:
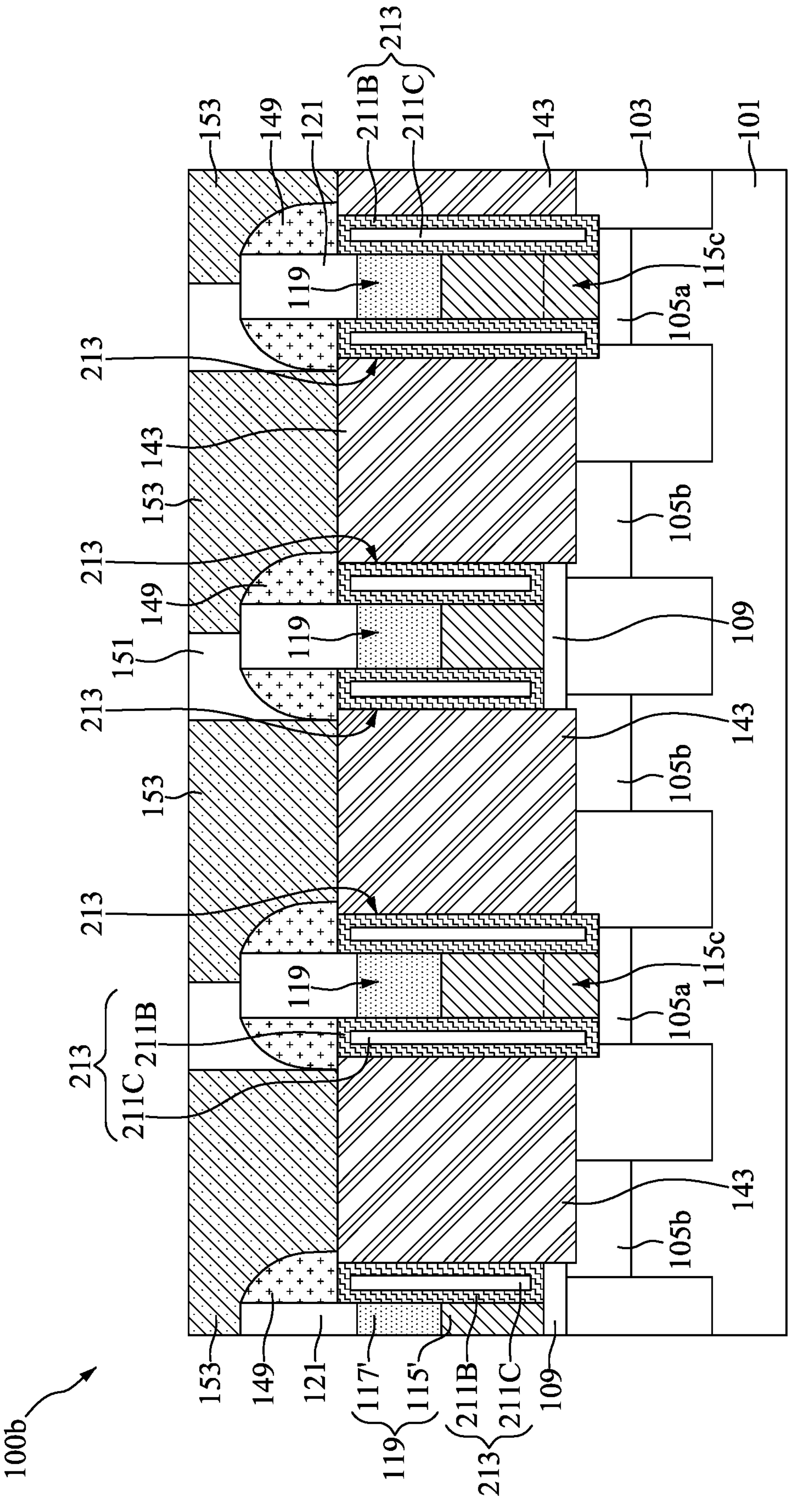
FIG. 19 is a cross-sectional view illustrating an intermediate stage during the formation of the semiconductor device, in accordance with some embodiments.
Figure 20:
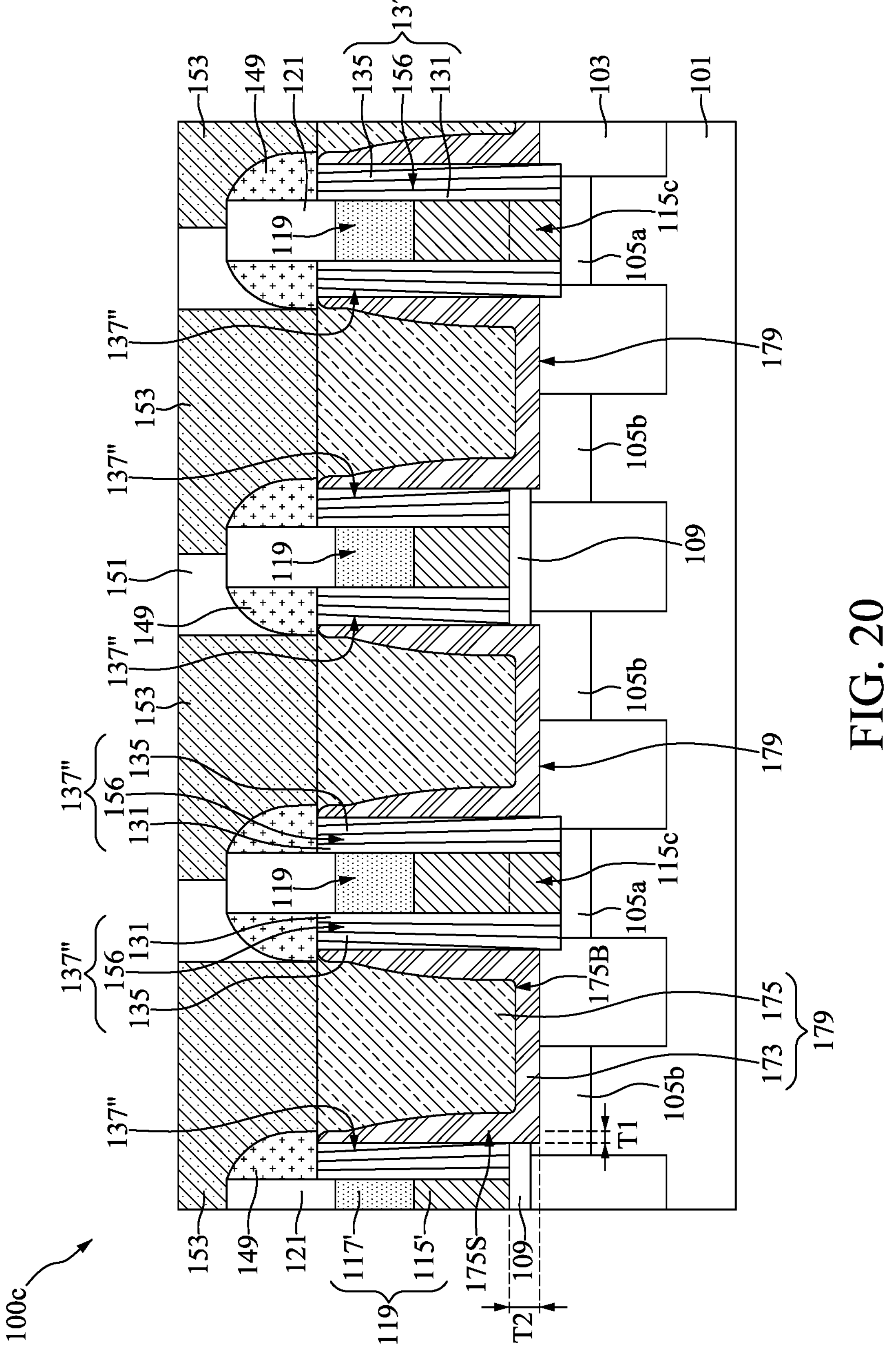
FIG. 20 is a cross-sectional view illustrating an intermediate stage during the formation of the semiconductor device, in accordance with some embodiments.
Figure 21:
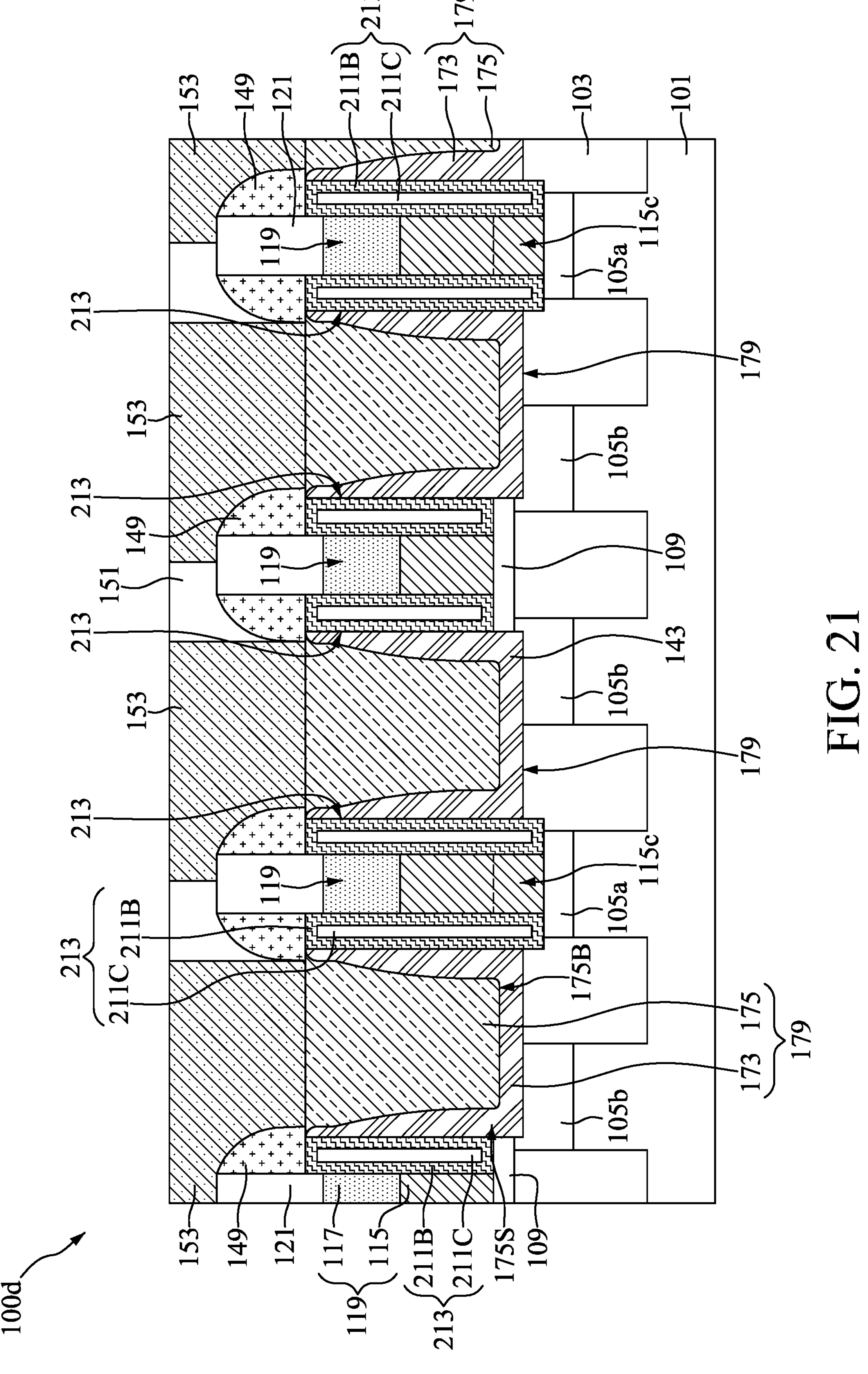
FIG. 21 is a cross-sectional view illustrating an intermediate stage during the formation of the semiconductor device, in accordance with some embodiments.

FIG. 1 is a flow diagram illustrating a method 10 for forming a semiconductor device, such as a semiconductor device 100*a* shown in FIG. 18, a semiconductor device 100*b* shown in FIG. 19, a semiconductor device 100*c* shown in FIG. 20 and a semiconductor device 100*d* shown in FIG. 21, and the method 10 includes steps S11, S13, S15, S17, S19, S21, and S23, in accordance with some embodiments.

The steps S11 to S23 are first introduced briefly and then elaborated in connection with the following figures. As shown in FIG. 1, the method 10 begins at step S11 where source/drain regions are formed in a semiconductor substrate. In some embodiments, an isolation structure is formed in the semiconductor substrate to define active areas, and the source/drain regions are formed in the active areas. At step S13, bit line structures are formed over the semiconductor substrate. In some embodiments, the material layers of the bit line structures are sequentially formed over the semiconductor substrate, and the material layers are etched using an overlying patterned mask as a mask.

At step S15, first spacer structures are formed on sidewalls of the bit line structures. In some embodiments, each of the first spacer structures is a tri-layer structure including an inner spacer contacting the bit line structures, a middle spacer, and an outer spacer separating from the inner spacer by the middle spacer. In some embodiments, each of the first spacer structures is a single layer structure (e.g., the middle spacer) contacting the bit line structures and the patterned mask. Moreover, in some embodiments, the middle spacers of the first spacer structures are made of an energy removable material. At step S17, capacitor contacts (also referred to as CC contacts) are formed over the semiconductor substrate and adjacent to the first spacer structures. In some embodiments, each of the capacitor contacts is a single contact. In some embodiments, each of the capacitor contacts is a composite contact. In some embodiments, a first dielectric layer is formed over the semiconductor substrate after the first spacer structures are formed, and the capacitor contacts are formed penetrating through the first dielectric layer to connect to the underlying source/drain regions physically and electrically. In addition, in some embodiments, the first spacer structures are partially etched during the formation of the capacitor contacts.

At step S19, second spacer structures are formed over the first spacer structures. In some embodiments, the second spacer structures extend to cover portions of the capacitor contacts.

At step S21, conductive pads are formed over the capacitor contacts and covering the second spacer structures. In some embodiments, a second dielectric layer is formed over the capacitor contacts and the second spacer structures, and the conductive pads are formed penetrating through the second dielectric layer to connect to the capacitor contacts physically and electrically. In some embodiments, the second spacer structures are covered by the conductive pads. At step S23, a heat treatment process is performed to transform portions of the first spacer structures into air gaps. In some embodiments, the middle spacers of the first spacer structures are made of an energy removable material, which can be transformed into the air gaps by the heat treatment process. In some embodiments, after heat treatment process, the air gaps are sandwiched between the inner spacers and the outer spacer of the first spacer structures. In some embodiments, after heat treatment process, the air gaps are enclosed by a liner.

Note that if the first spacer structure at step S15 is a single layer (e.g., the middle spacer), the semiconductor device 100*b* of FIG. 19 may be obtained. If the capacitor contact at step S17 is a composite contact, the semiconductor device 100*c* of FIG. 20 may be obtained. In other words, the semiconductor device 100*a* includes a first spacer structure of tri-layer structure and a capacitor contact of single contact, the semiconductor device 100*b* includes a first spacer structure of single layer structure and a capacitor contact of single contact and, the semiconductor device 100*c* includes a first spacer structure of tri-layer structure and a capacitor contact of composite contact. Any combination of the first spacer structure and the capacitor contact thereof is possible. In some other embodiments, the semiconductor device includes a first spacer structure of single layer structure and a capacitor contact of composite contact, as semiconductor device 100*d* shown in FIG. 21. In some embodiments, the semiconductor devices 100*a*, 100*b*, 100*c* and 100*d* are parts of dynamic random-access memory (DRAM). The steps S11 to S23 of FIG. 1 are elaborated in connection with the following figures.

FIGS. 2, 4, 6, 8, 10, 12, 14 and 16 are top views illustrating intermediate stages in the formation of the semiconductor device 100*a*, and FIGS. 3, 5, 7, 9, 11, 13, 15, 17 and 18 are cross-sectional views illustrating intermediate stages in the formation of the semiconductor device 100*a*, in accordance with some embodiments. It should be noted that FIGS. 3, 5, 7, 9, 11, 13, 15 and 17 are cross-sectional views along the sectional line A-A' of FIGS. 2, 4, 6, 8, 10, 12, 14 and 16, respectively.

Figure 2:
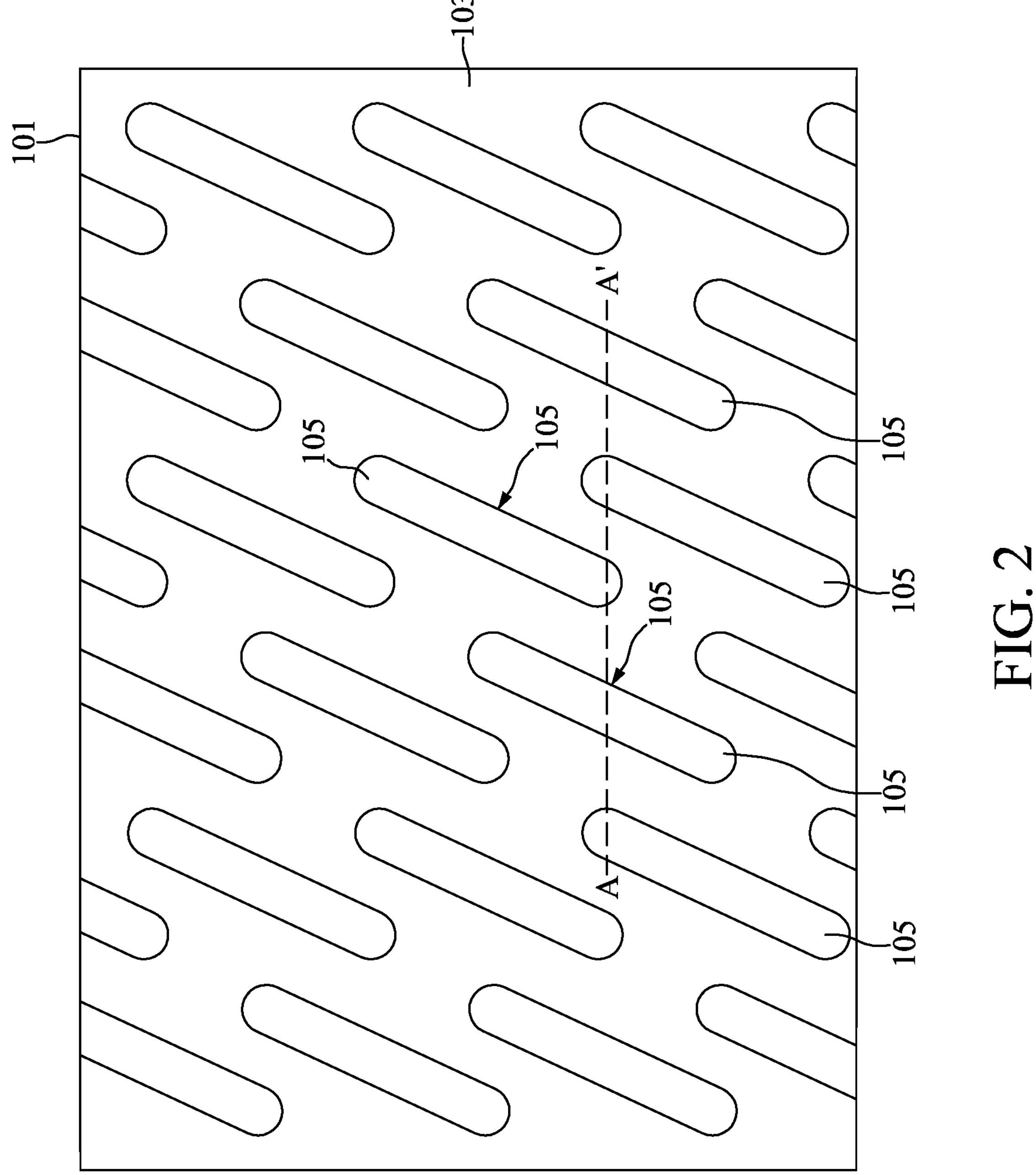
FIG. 2 is a top view illustrating an intermediate stage of forming an isolation structure in a semiconductor substrate during the formation of the semiconductor device, in accordance with some embodiments.
Figure 3:
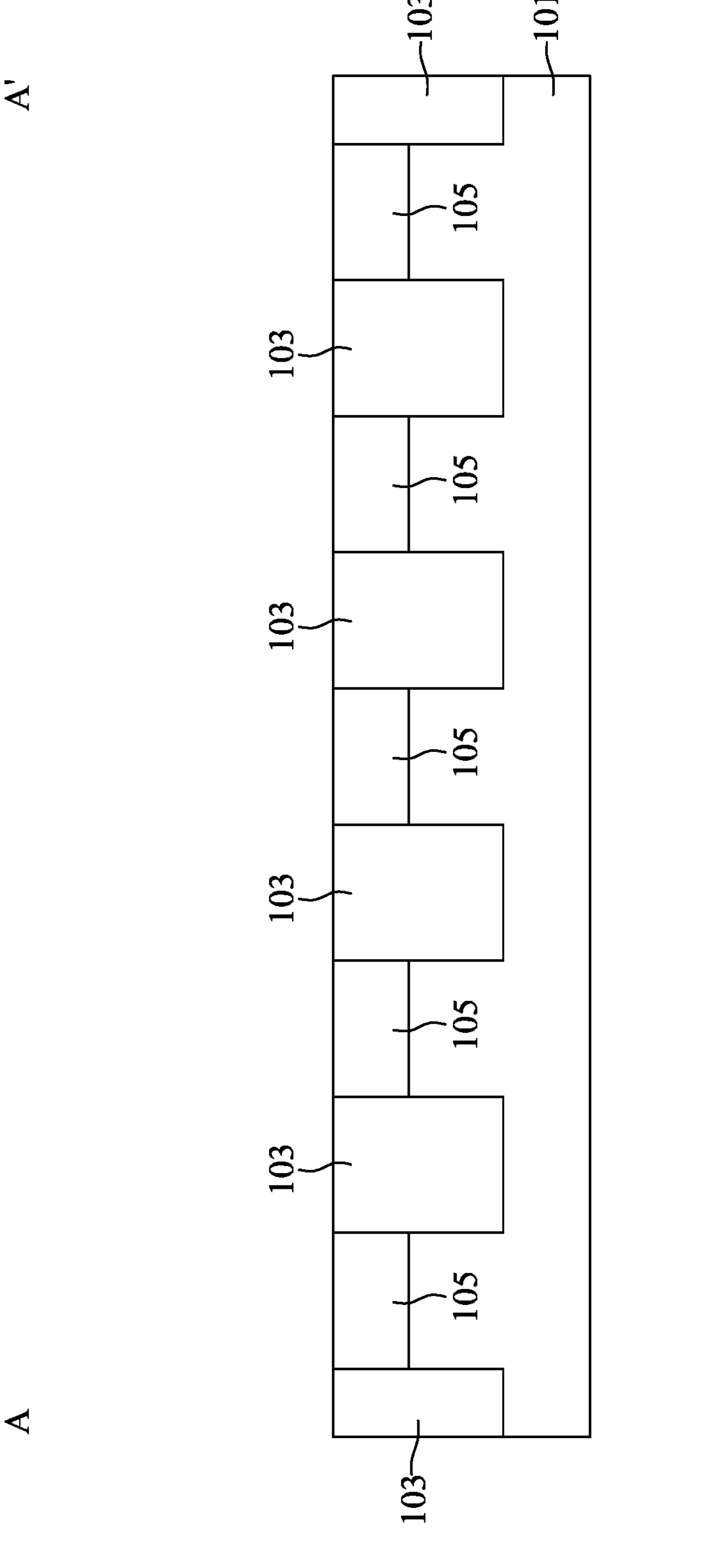
FIG. 3 is a cross-sectional view illustrating an intermediate stage during the formation of the semiconductor device along the sectional line A-A' of FIG. 2, in accordance with some embodiments.

As shown in FIGS. 2 and 3, a semiconductor substrate 101 is provided. The semiconductor substrate 101 may be a semiconductor wafer such as a silicon wafer. Alternatively, or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

Still referring to FIGS. 2 and 3, an isolation structure 103 is formed in the semiconductor substrate 101 to define active areas, and the isolation structure 103 is a shallow trench isolation (STI) structure, in accordance with some embodiments. The isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form an opening (not shown) by using the patterned mask as a mask, depositing a dielectric material in the opening and over the semiconductor substrate 101, and planarizing the dielectric material until the semiconductor substrate 101 is exposed.

Moreover, doped regions 105 are formed in the active areas defined by the isolation structure 103. In some embodiments, the doped regions 105 are formed by one or more ion implantation processes, and P-type dopants, such as boron (B), gallium (Ga), or indium (In), or N-type dopants, such as phosphorous (P) or arsenic (As), can be implanted in the active areas to form the doped regions 105, depending on the conductivity type of the semiconductor device **100*a*. In addition, the doped regions 105 will become the source/drain regions of the semiconductor device 100*a*** in the subsequent processes.

Figure 4:
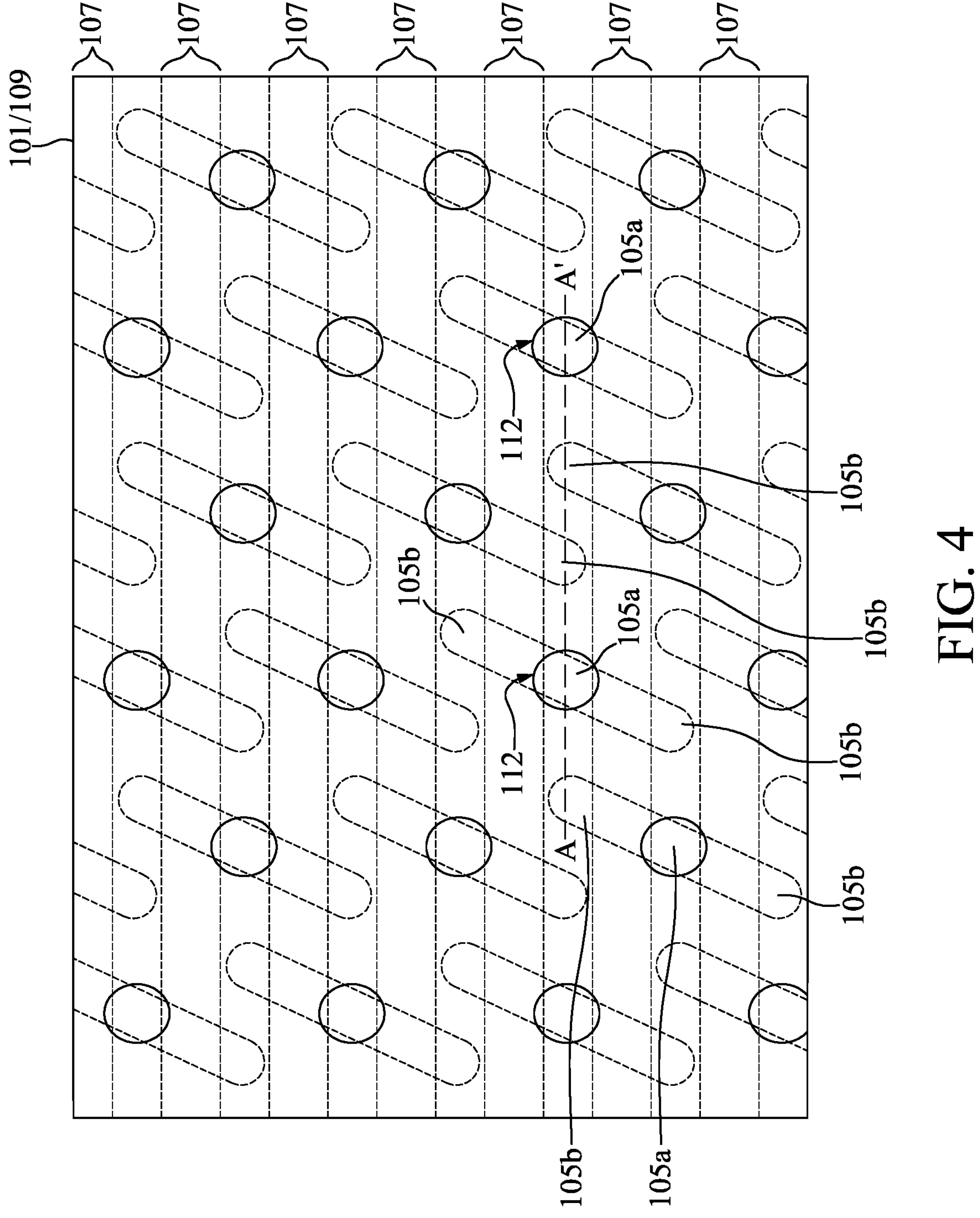
FIG. 4 is a top view illustrating an intermediate stage of etching the semiconductor substrate to form openings during the formation of the semiconductor device, in accordance with some embodiments.
Figure 5:
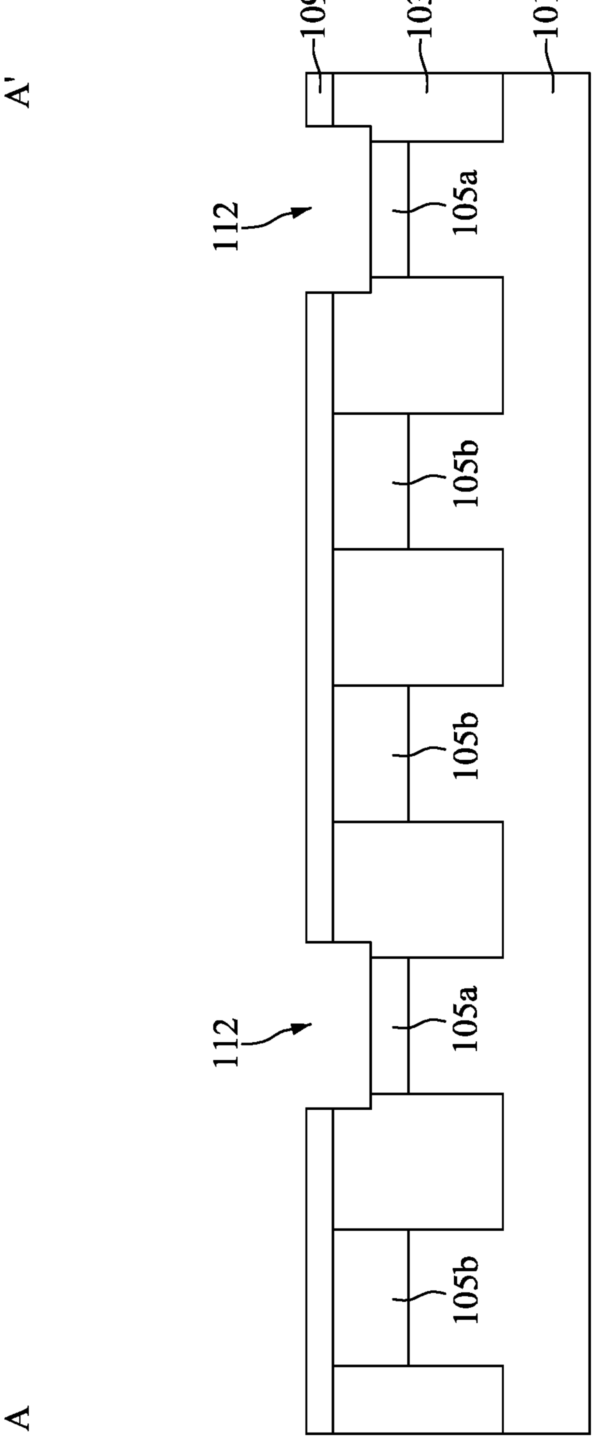
FIG. 5 is a cross-sectional view illustrating an intermediate stage during the formation of the semiconductor device along the sectional line A-A' of FIG. 4, in accordance with some embodiments.

After the doped regions 105 are formed, word line structures 107 are formed penetrating through the doped regions 105 to form source/drain regions **105*a* and 105*b*, as shown in FIGS. 4 and 5 in accordance with some embodiments. The respective step is illustrated as the step S11 in the method 10 shown in FIG. 1. In some embodiments, the word line structures 107 are embedded in the semiconductor substrate 101** and arranged parallel to each other.

Each of the word line structures 107 may include a gate dielectric layer (not shown) and a gate electrode (not shown) over the gate dielectric layer. The gate dielectric layers may include silicon oxide, silicon nitride, silicon oxynitride, a dielectric material with high dielectric constant (high-k), or a combination thereof, and the gate electrodes may include a conductive material such as aluminum (Al), copper (Cu), tungsten (W), titanium (Ti), tantalum (Ta), or may be a multi-layer structure including any combination of the above materials. The formation of the word line structures 107 may include etching the semiconductor substrate 101 to form trenches, and performing one or more deposition and etching processes to form the word line structures 107 in the trenches.

Moreover, in the present embodiment, each of the active areas is penetrated by two parallel word line structures 107, as shown in FIG. 4. In some embodiments, the source/drain regions **105*b* are located at opposite end portions of the active areas, and the source/drain regions 105*a* are located at middle portions of the active areas. Still referring to FIGS. 4 and 5, after the source/drain regions 105*a*, 105*b* and the word line structures 107 are formed, a buffer layer 109 is formed over the semiconductor substrate 101, and openings 112 (i.e., bit line contact openings) are formed in the semiconductor substrate 101 and over the source/drain regions 105*a***, in accordance with some embodiments.

The buffer layer 109 may include one or more insulating layers. For example, the buffer layer 109 may include at least one or two of a silicon oxide layer, a silicon nitride layer, or a silicon oxynitride layer. The formation of the openings 112 may include forming a patterned mask (not shown) over the buffer layer 109 and etching the buffer layer 109 and the semiconductor substrate 101 using the patterned mask as a mask. More specifically, upper portions of the source/drain regions **105*a* are etched to form the openings 112**.

Figure 6:
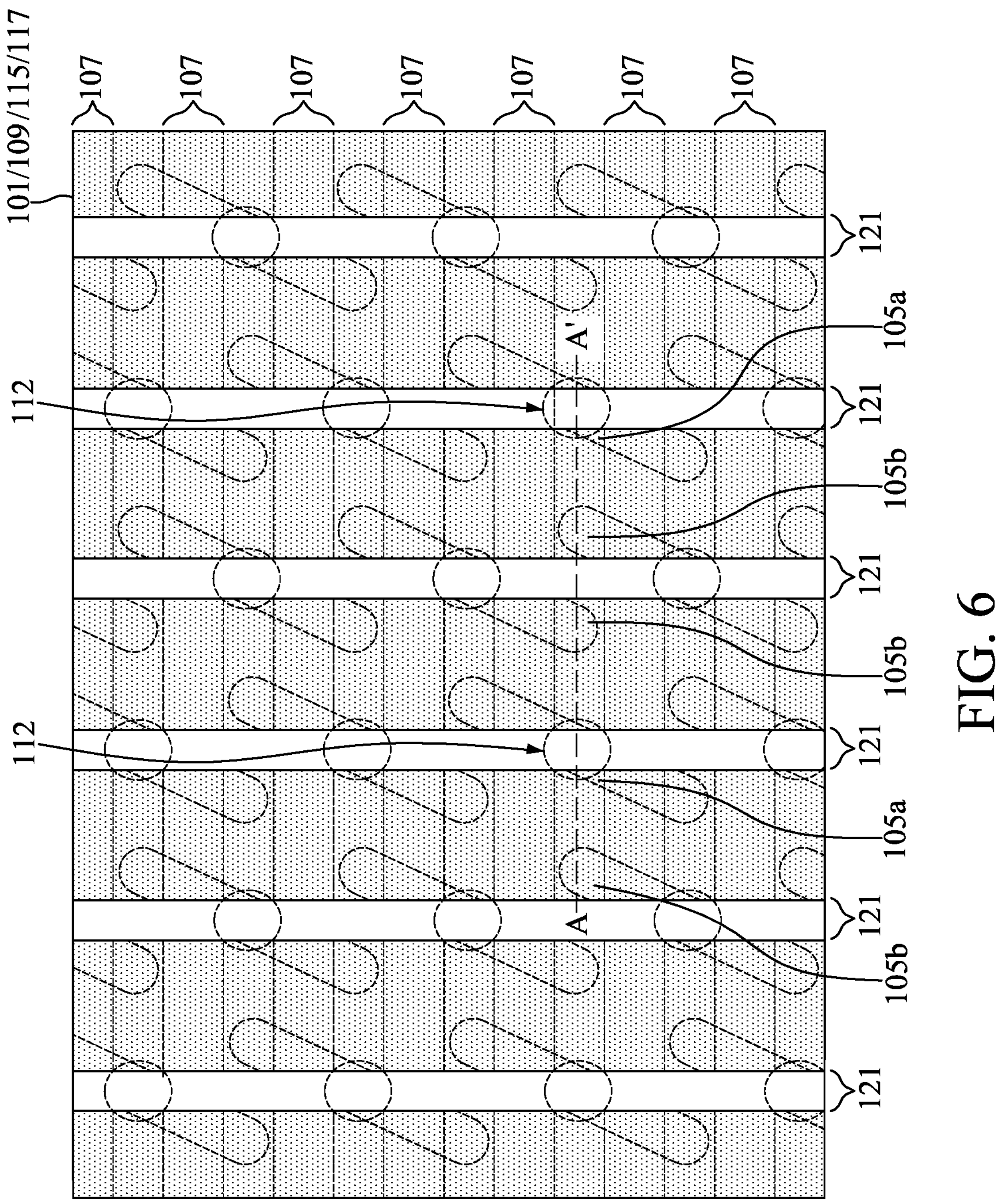
FIG. 6 is a top view illustrating an intermediate stage of sequentially forming a semiconductor layer, a metal layer, and a patterned mask over the semiconductor substrate during the formation of the semiconductor device, in accordance with some embodiments.
Figure 7:
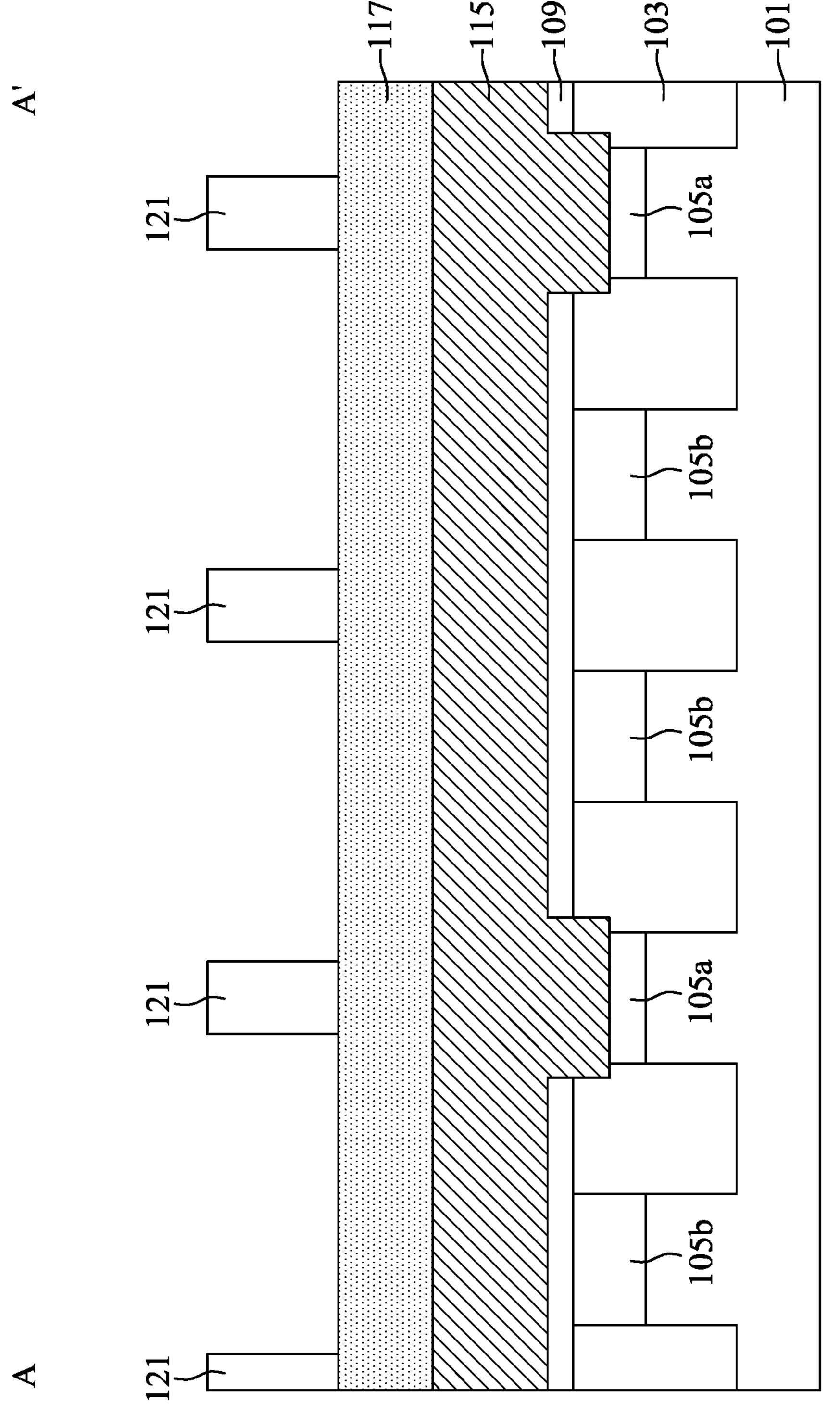
FIG. 7 is a cross-sectional view illustrating an intermediate stage during the formation of the semiconductor device along the sectional line A-A' of FIG. 6, in accordance with some embodiments.

Next, a semiconductor layer 115 is formed over the buffer layer 109, a metal layer 117 is formed over the semiconductor layer 115, and a patterned mask 121 is formed over the metal layer 117, as shown in FIGS. 6 and 7 in accordance with some embodiments. In some embodiments, the openings 112 are filled by the semiconductor layer 115. In some embodiments, the semiconductor layer 115 includes doped polysilicon. In some other embodiments, the semiconductor layer 115 includes metal, metal silicide, metal compound, or a combination thereof. The semiconductor layer 115 may be formed by a deposition process, such as a chemical vapor deposition (CVD) process, a physical vapor deposition (PVD) process, or an atomic layer deposition (ALD) process. In some embodiments, the metal layer 117 includes one or more metals, such as tungsten (W). In addition, the metal layer 117 may be formed by a CVD process, a PVD process, an ALD process, a metal organic CVD (MOCVD) process, a sputtering process, a plating process, or a combination thereof.

Figure 8:
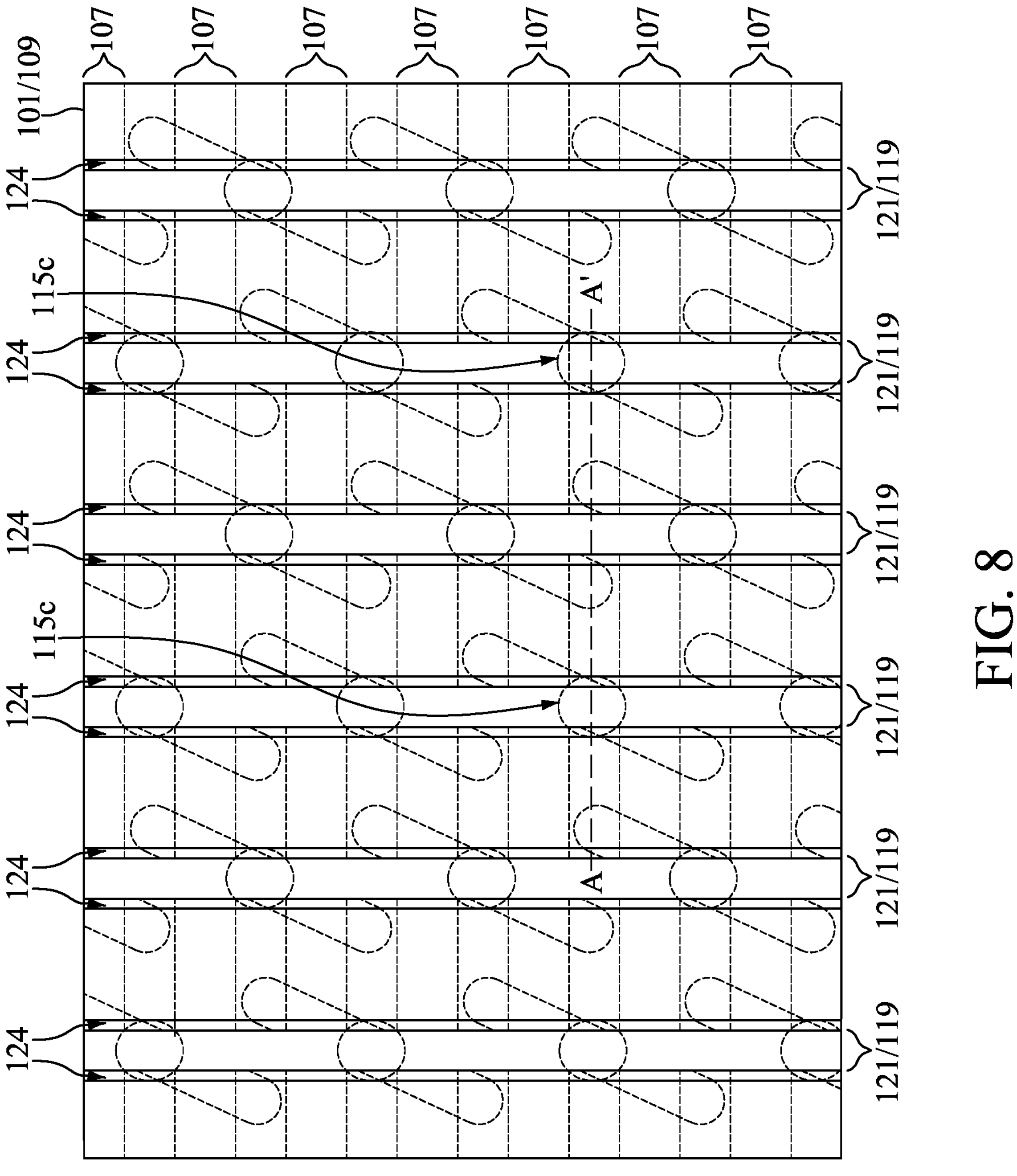
FIG. 8 is a top view illustrating an intermediate stage of etching the semiconductor layer and the metal layer to form bit line structures during the formation of the semiconductor device, in accordance with some embodiments.
Figure 9:
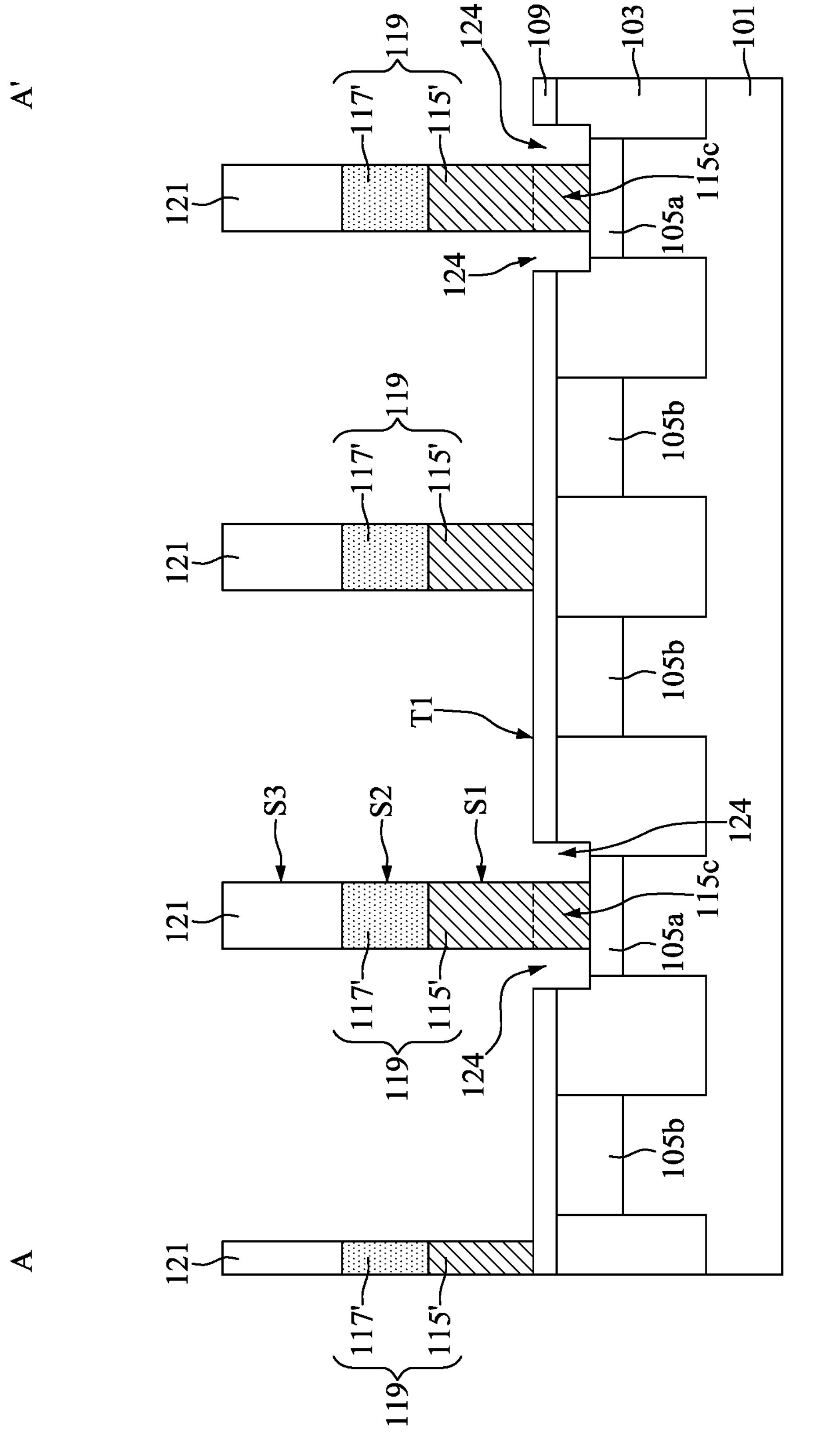
FIG. 9 is a cross-sectional view illustrating an intermediate stage during the formation of the semiconductor device along the sectional line A-A' of FIG. 8, in accordance with some embodiments.

Then, the metal layer 117 and the semiconductor layer 115 are etched using the patterned mask 121 as a mask to form bit line structures 119 over the semiconductor substrate 101, as shown in FIGS. 8 and 9 in accordance with some embodiments. The respective step is illustrated as the step S13 in the method 10 shown in FIG. 1. Each of the bit line structures 119 includes a semiconductor pattern 115' and a metal pattern 117'. The etching process may include a dry etching process, a wet etching process, or a combination thereof.

In some embodiments, the portions of the semiconductor layer 115 filled in the openings 112 (see FIGS. 4 and 5) are etched to form gaps 124 alongside of the bit line structures

119, and the portions of the semiconductor patterns 115' remain in the openings 112 (below the top surface T1 of the buffer layer 109) are referred to as bit line contacts 115*c*. The dashed lines indicating the boundaries of the bit line contacts 115*c* and the bit line structures 119 are used to clarify the disclosure. No obvious interfaces exist between the bit line contacts 115*c* and the bit line structures 119.

In some embodiments, the source/drain regions 105*a* are partially exposed by the gaps 124, and the gaps 124 are located within the openings 112. Moreover, sidewalls S1 of the semiconductor patterns 115', sidewalls S2 of the metal patterns S2, and sidewalls S3 of the patterned mask 121 are substantially aligned after the etching process. Within the context of this disclosure, the word "substantially" means preferably at least 90%, more preferably 95%, even more preferably 98%, and most preferably 99%.

Figure 10:
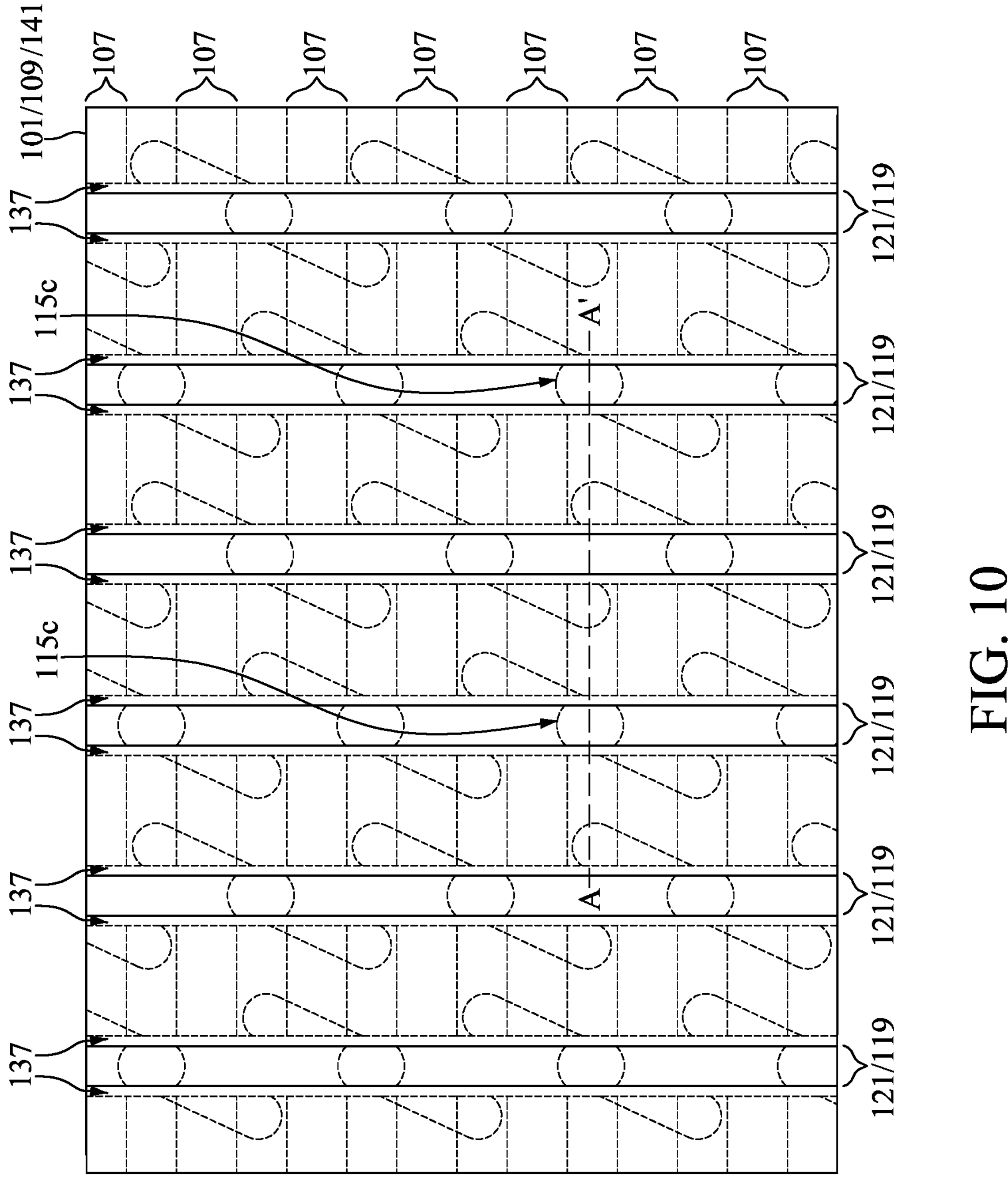
FIG. 10 is a top view illustrating an intermediate stage of forming first spacer structures on sidewalls of the bit line structures during the formation of the semiconductor device, in accordance with some embodiments.
Figure 11:
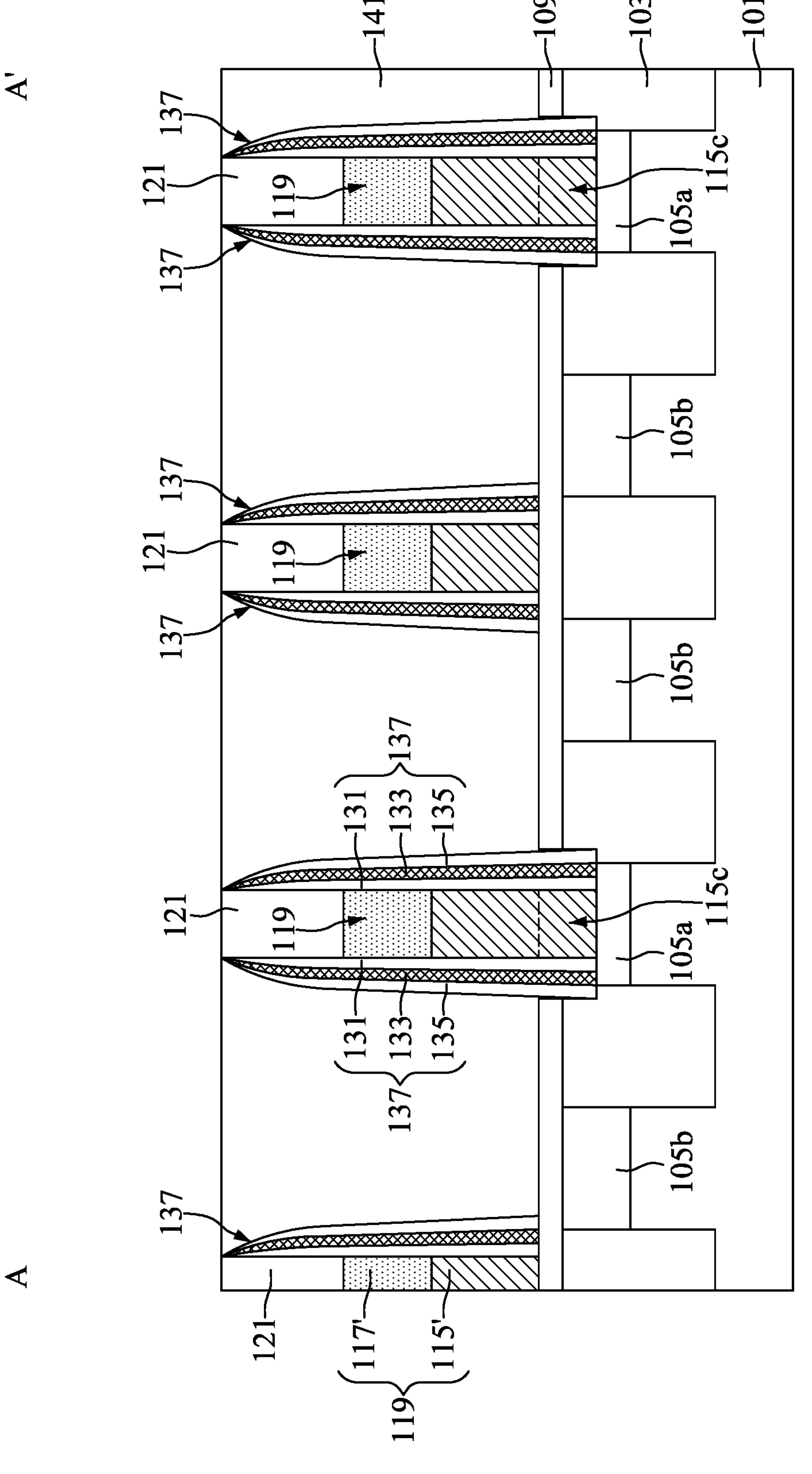
FIG. 11 is a cross-sectional view illustrating an intermediate stage during the formation of the semiconductor device along the sectional line A-A' of FIG. 10, in accordance with some embodiments.

Subsequently, first spacer structures 137 are formed on the sidewalls of the bit line structures 119 (including the sidewalls S1 of the semiconductor patterns 115' and the sidewalls S2 of the metal patterns 117') and on the sidewalls S3 of the patterned mask 121, as shown in FIGS. 10 and 11 in accordance with some embodiments. The respective step is illustrated as the step S15 in the method 10 shown in FIG. 1. In some embodiments, the gaps 124 (see FIGS. 8 and 9) are filled by the first spacer structures 137.

In some embodiments, each of the first spacer structures 137 includes an inner spacer 131 contacting the bit line structures 119 and the patterned mask 121, a middle spacer 133, and an outer spacer 135 separating from the inner spacer 131 by the middle spacer 133. In some embodiments, the inner spacers 131 and the outer spacers 135 are made of high-density carbon, silicon carbide (SiC), silicon carbon nitride (SiCN), doped oxide, or another applicable dielectric material, although any other materials may alternatively be utilized. In some embodiments, the middle spacers 133 are made of an energy removable material.

In some embodiments, the energy removable material of the middle spacers 133 includes a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the spaces originally occupied by the middle spacers 133 in the subsequent processes.

In some embodiments, the formation of the inner spacers 131 includes conformally depositing an inner spacer material (not shown) over the structure of FIGS. 8 and 9. The deposition process may include a CVD process, a PVD process, an ALD process, a spin-on coating process, or another applicable process. Then, the inner spacer material may be etched by an anisotropic etching process, which removes the same amount of the spacer material vertically in all places, leaving the inner spacers 131 on the sidewalls S1, S2 of the bit line structures 119 and, on the sidewalls, S3 of the patterned mask 121. In some embodiments, the etching process is a dry etching process. Some processes used to form the middle spacers 133 and the outer spacers 135 are similar to, or the same as those used to form the inner spacers 131, and details thereof are not repeated herein.

After the first spacer structures 137 are formed, a first dielectric layer 141 is formed to fill a plurality of spaces between the first spacer structures 137 and over the source/drain regions 105*b*, as shown in FIGS. 10 and 11 in accordance with some embodiments. The first dielectric layer 141 may be made of a low-k dielectric material. In some embodiments, the low-k dielectric material has a dielectric constant (k value) less than about 4. Examples of the low-k dielectric material include, but not limited to, silicon oxide, silicon nitride, silicon oxynitride (SiON), silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. The dielectric layer 141 may be formed by a deposition process. After the dielectric layer 141 is deposited, a planarization process may be performed until the patterned mask 121 is exposed. The planarization process may be a chemical mechanical polishing (CMP) process.

Figure 12:
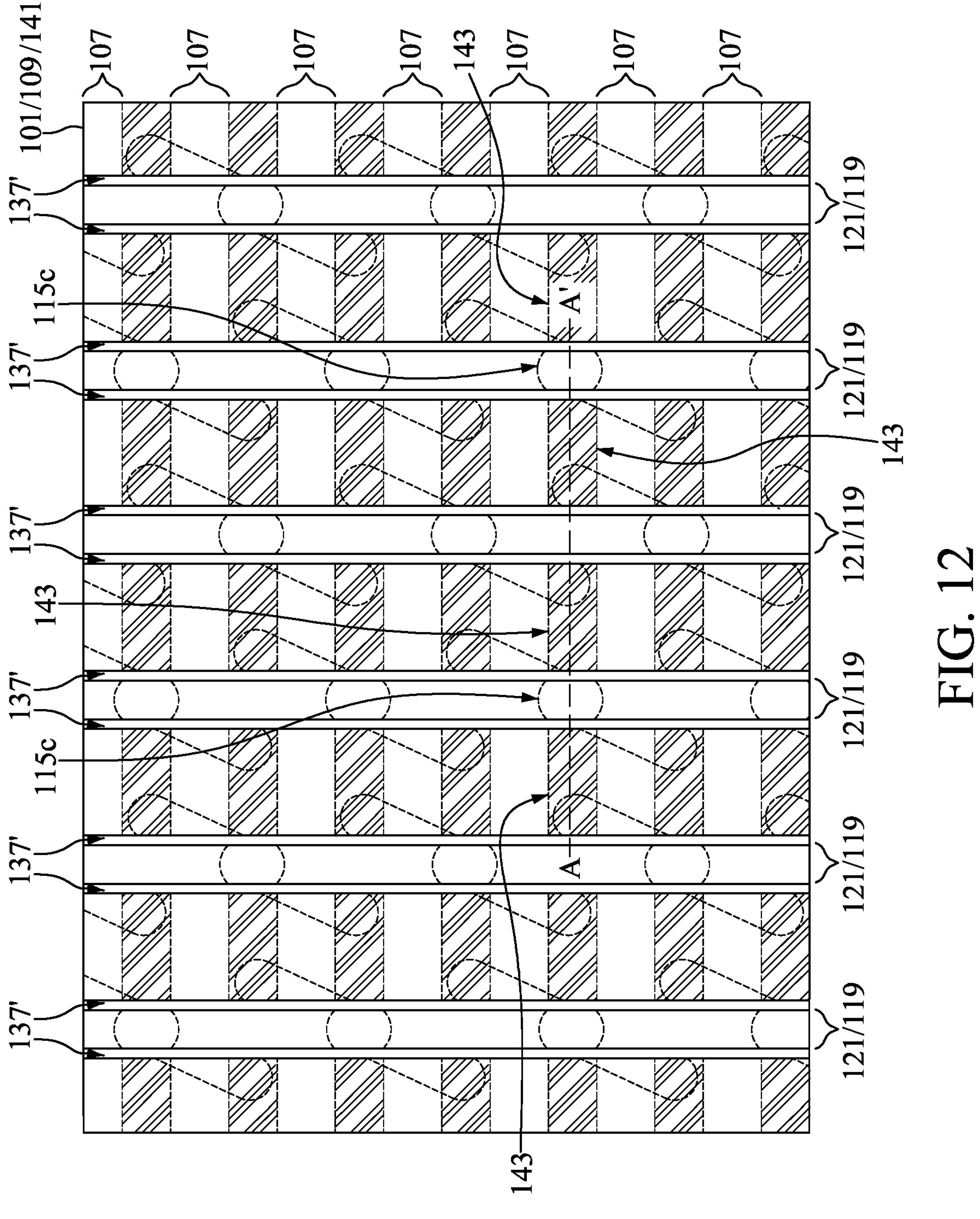
FIG. 12 is a top view illustrating an intermediate stage of forming capacitor contacts adjacent to the first spacer structures during the formation of the semiconductor device, in accordance with some embodiments.
Figure 13:
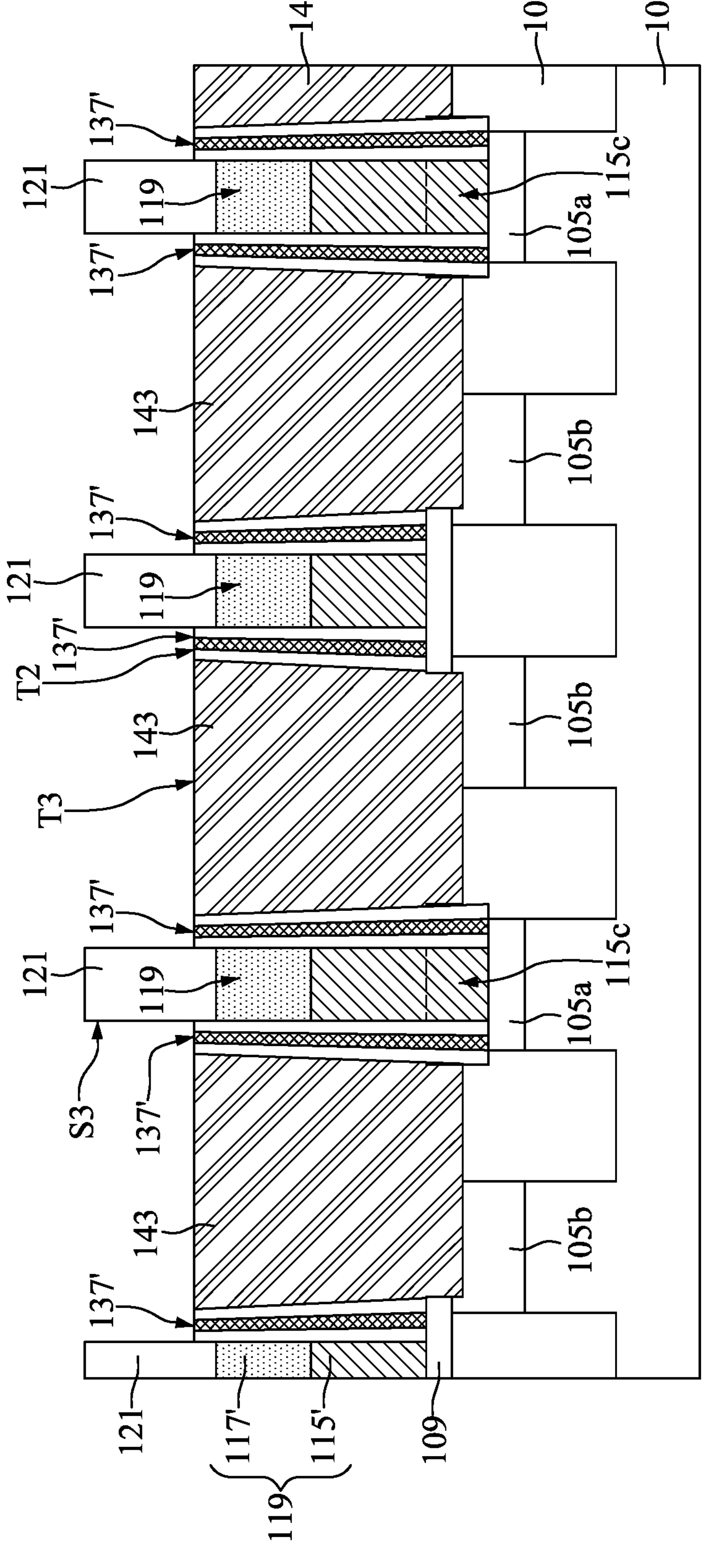
FIG. 13 is a cross-sectional view illustrating an intermediate stage during the formation of the semiconductor device along the sectional line A-A' of FIG. 12, in accordance with some embodiments.

Next, openings (not shown) are formed penetrating through the first dielectric layer 141 and the barrier layer 109 such that the source/drain regions 105*b* are exposed, and capacitor contacts 143 are formed in the openings, as shown in FIGS. 12 and 13 in accordance with some embodiments. The respective step is illustrated as the step S17 in the method 10 shown in FIG. 1. In some embodiments, the openings exposing the source/drain regions 105*b* are formed by a dry etching process. In some embodiments, the capacitor contacts 143 are formed by a deposition process and a subsequent etch-back process.

Specifically, the formation of the capacitor contacts 143 includes depositing a conductive material (not shown) in the openings exposing the source/drain regions 105*b* and performing an etch-back process on the conductive material to form the capacitor contacts 143. In some embodiments, the first spacer structures 137 are partially etched during the etch-back process for forming the capacitor contacts 143, such that the top surfaces T2 of the etched first spacer structures 137' are substantially coplanar with the top surfaces T3 of the capacitor contacts 143. In addition, in some embodiments, the etched first spacer structures 137' are in direct contact with the capacitor contacts 143. The capacitor contacts 143 may include copper (Cu), tungsten (W), aluminum (Al), titanium (Ti), tantalum (Ta), gold (Au), silver (Ag), a combination thereof, or another applicable conductive material.

Figure 14:
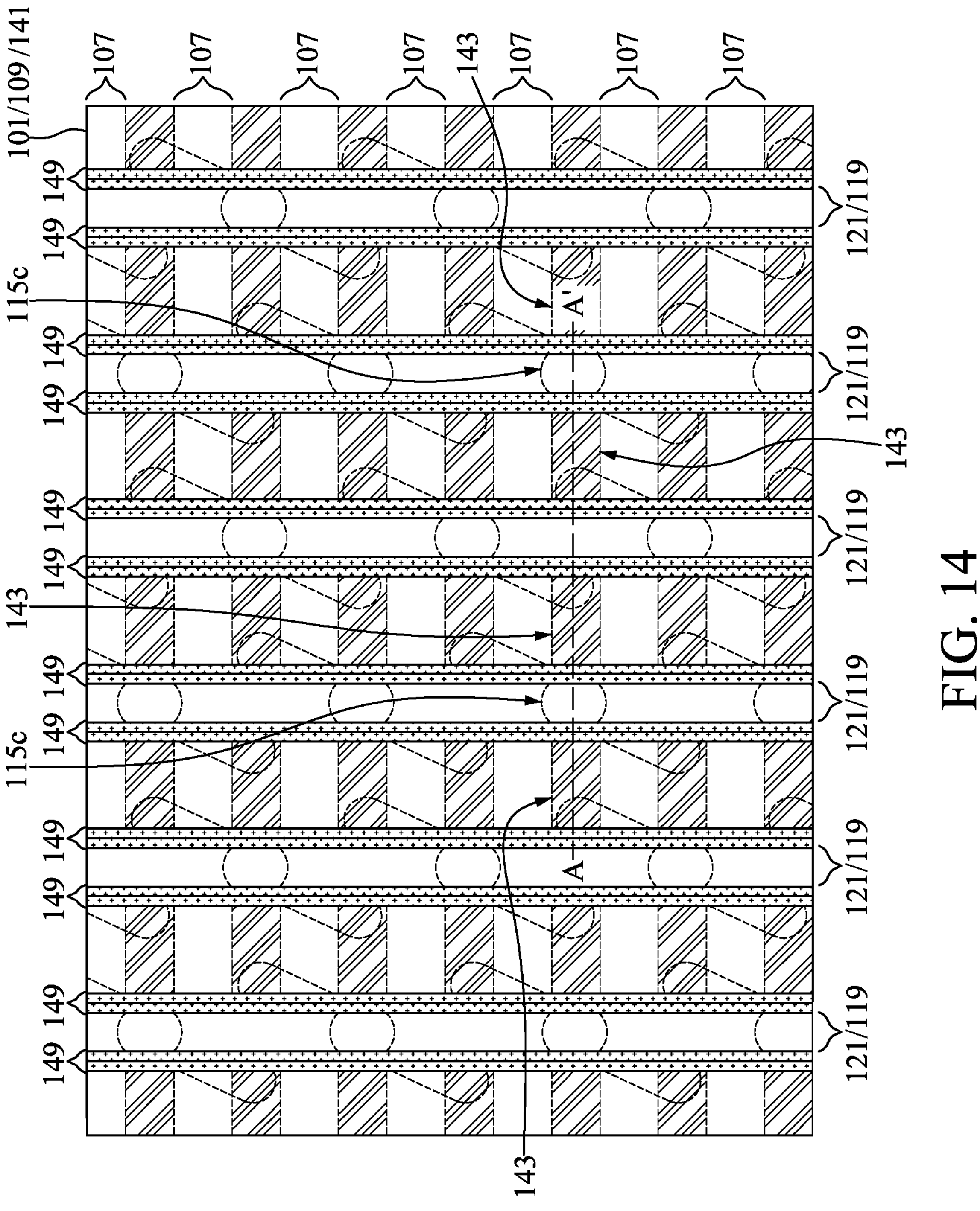
FIG. 14 is a top view illustrating an intermediate stage of forming second spacer structures over the first spacer structures during the formation of the semiconductor device, in accordance with some embodiments.
Figure 15:
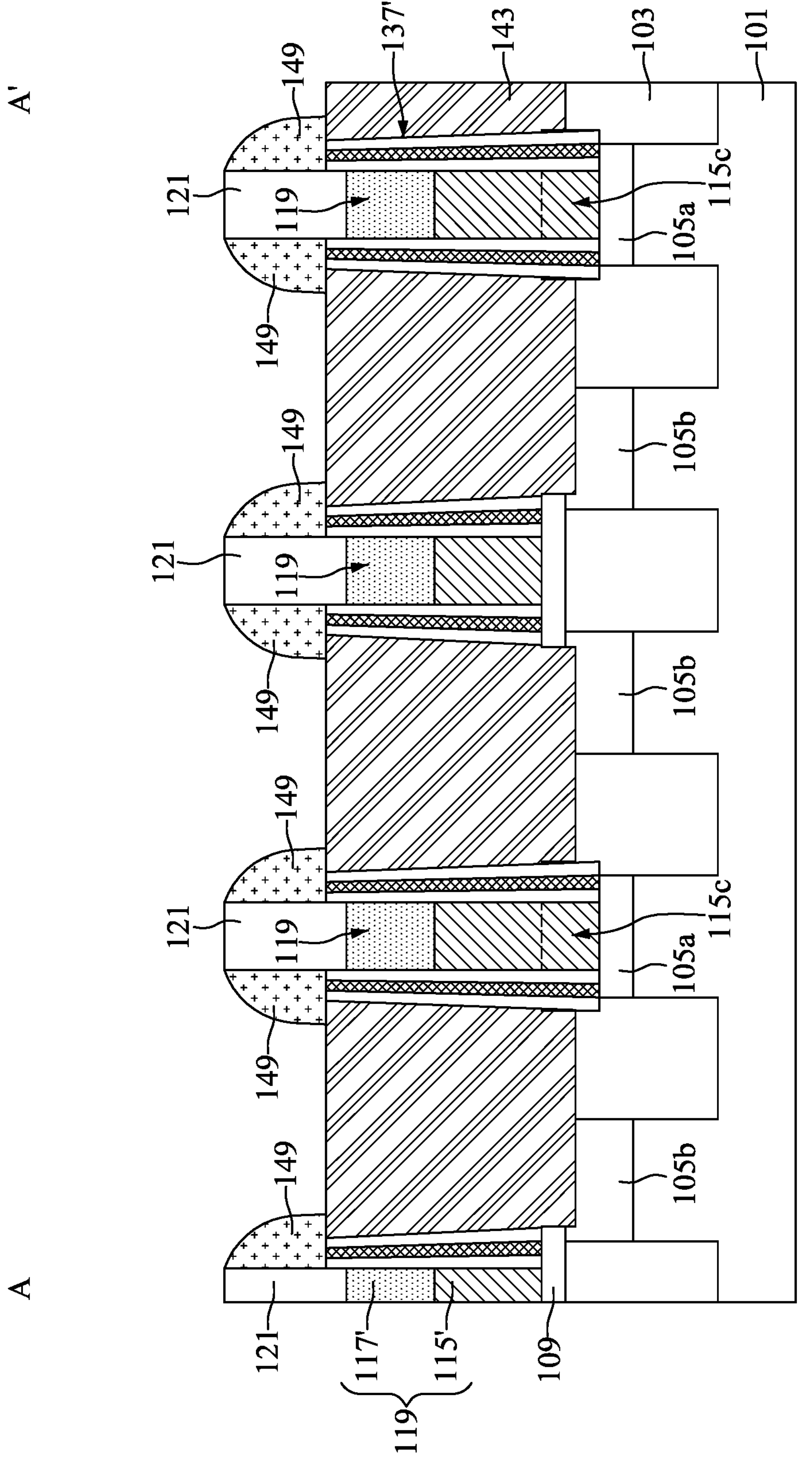
FIG. 15 is a cross-sectional view illustrating an intermediate stage during the formation of the semiconductor device along the sectional line A-A' of FIG. 14, in accordance with some embodiments.

Then, second spacer structures 149 are formed over the etched first spacer structures 137' as shown in FIGS. 14 and 15 in accordance with some embodiments. The respective step is illustrated as the step S19 in the method 10 shown in FIG. 1. In some embodiments, the second spacer structures 149 are formed on the sidewalls S3 (see FIG. 13) of the patterned mask 121. Specifically, the second spacer structures 149 are in direct contact with the top surfaces T2 of the first spacer structures 137', the top surfaces T3 of the capacitor contacts 143, and the sidewalls S3 of the patterned mask 121, in accordance with some embodiments. Some materials and processes used to form the second spacer structures 149 are similar to, or the same as those used to form the inner spacers 131 of the first spacer structures 137, and details thereof are not repeated herein.

Figure 16:
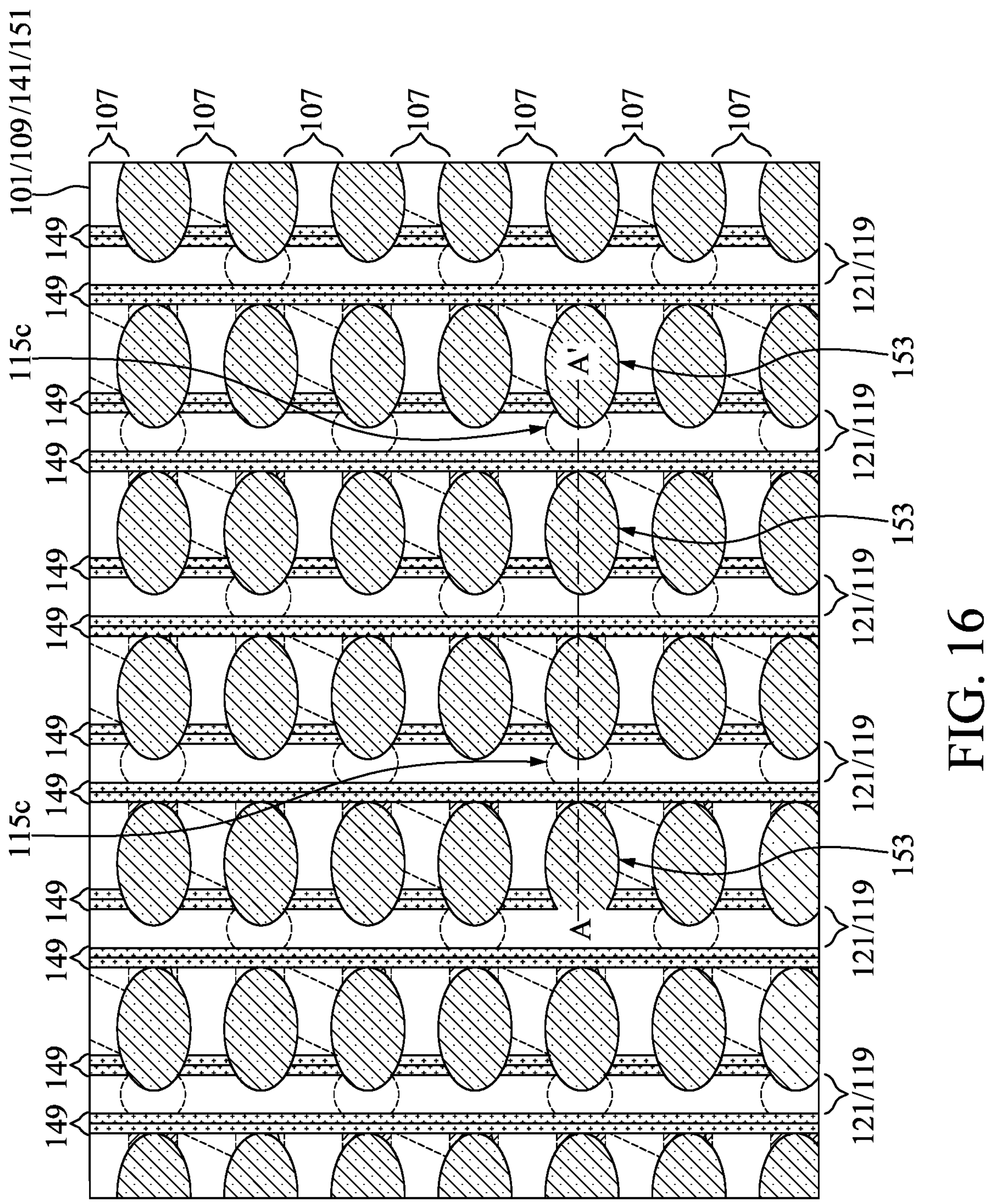
FIG. 16 is a top view illustrating an intermediate stage of forming conductive pads over the capacitor contacts during the formation of the semiconductor device, in accordance with some embodiments.
Figure 17:
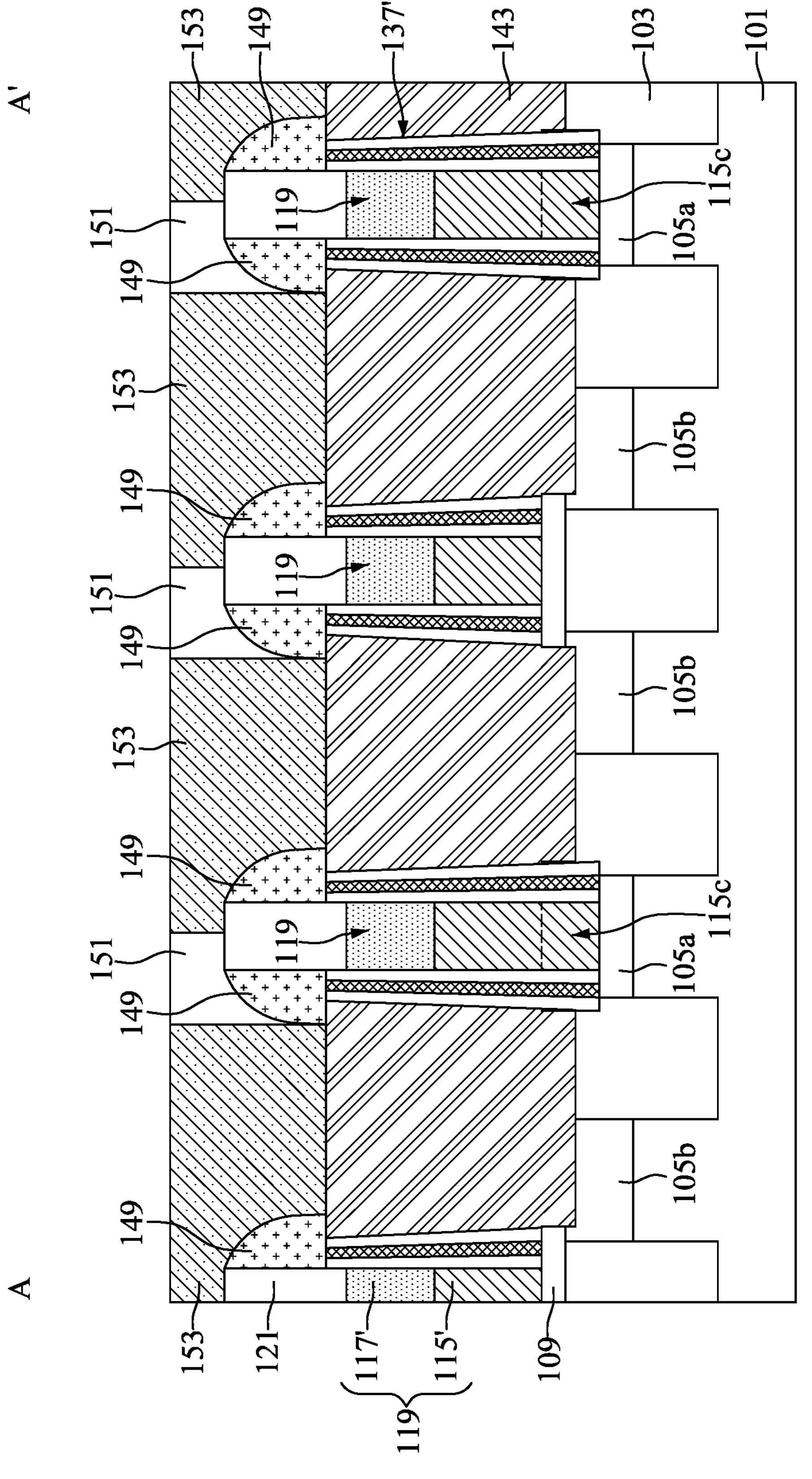
FIG. 17 is a cross-sectional view illustrating an intermediate stage during the formation of the semiconductor device along the sectional line A-A' of FIG. 16, in accordance with some embodiments.

Subsequently, a second dielectric layer 151 is formed over the structure of FIGS. 14 and 15, as shown in FIGS. 16 and 17 in accordance with some embodiments. After the second dielectric layer 151 is formed, openings (not shown) are formed penetrating through the second dielectric layer 151 such that the capacitor contacts 143 are exposed, and conductive pads 153 are formed in the openings. The respective step is illustrated as the step S21 in the method 10 shown in FIG. 1. In some embodiments, the second spacer structures 149 are covered by the conductive pads 153. In some embodiments, the second spacer structures 149 extend to cover portions of the patterned mask 121.

Some materials and processes used to form the second dielectric layer 151 are similar to, or the same as those used to form the first dielectric layer 141 (see FIGS. 10 and 11), and details thereof are not repeated herein. In some embodiments, the openings exposing the capacitor contacts 143 are formed by a dry etching process, and the conductive pads 153 are formed by a deposition process and a subsequent planarization process. The conductive pads 153 may include copper (Cu), tungsten (W), aluminum (Al), titanium (Ti), tantalum (Ta), gold (Au), silver (Ag), a combination thereof, or another applicable conductive material.

After the conductive pads 153 are formed, a heat treatment process is performed to transform the middle spacers 133 of the first spacer structures 137' into air gaps 156, as shown in FIG. 18 in accordance with some embodiment. FIG. 18 is a cross-sectional view illustrated along a similar cross-section as shown in FIG. 17. The respective step is illustrated as the step S23 in the method 10 shown in FIG. 1. After the heat treatment process, treated first spacer structures 137" with the air gaps 156 sandwiched between the inner spacers 131 and the outer spacers 135 are obtained.

In some other embodiment, the heat treatment process can be replaced by a light treatment process, an e-beam treatment process, a combination thereof, or another applicable energy treatment process. In some embodiments, the top portions of the air gaps 156 are sealed by the second spacer structures 149. After the air gaps 156 are formed in the first spacer structures 137" between the bit line structures 119 and the capacitor contacts 143, the semiconductor device **100*a* is obtained. In some embodiments, the semiconductor device 100*a*** is part of a dynamic random-access memory (DRAM).

FIG. 19 is a cross-sectional view illustrating an intermediate stage during the formation of the semiconductor device **100*b*, in accordance with some embodiments. Some materials and processes used to form the semiconductor device 100*b* are similar to, or the same as those used to form the semiconductor device 100*a***, and details thereof are not repeated herein.

As shown in FIG. 19, at step S15, each of the first spacer structures 137 formed on sidewalls of the bit line structures 119 having a single layer structure (i.e., the middle spacer 133) including a material composed of an energy removable material. In some embodiments, the gaps 124 (see FIGS. 8 and 9) are filled by the single layer structure (i.e., the first spacer structures 137). At step S17, in some embodiments, the etched first spacer structures 137', which also referred to as energy removable blocks 211A (not shown), have a trapezoidal shape. And, at step S23, the energy removable blocks 211A (i.e., the etched first spacer structures 137') transformed into an air gap structure 213 (i.e., the treated first spacer structures 137") including an air gap 211C enclosed by a liner 211B after a heat treatment process is performed. In some embodiments, the semiconductor device **100*b*** is part of a DRAM.

FIG. 20 is a cross-sectional view illustrating an intermediate stage during the formation of the semiconductor device **100*c*, in accordance with some embodiments. Some materials and processes used to form the semiconductor device 100*c* are similar to, or the same as those used to form the semiconductor device 100*a***, and details thereof are not repeated herein.

As shown in FIG. 20, at step S17, each of the capacitor contacts 143 formed in the openings (not shown) having a composite contact 179. In contrast to the single contact (i.e., the capacitor contact 143 in FIG. 18), the composite contact 179 in FIG. 20 includes a barrier layer 173 and a conductive layer 175 disposed over and surrounded by the barrier layer 173. In some embodiments, the barrier layers 173 include titanium (Ti), titanium nitride (TiN), or a combination thereof, and the conductive layers 175 include tungsten (W). In some embodiments, the conductive layers 175 are separated from the treated first spacer structure 137" (or the etched first spacer structure 137'), the source/drain regions **105*b* and the semiconductor substrate 101 by the barrier layers 173**.

It should be noted that each of the barrier layers 173 has a first thickness T1 on the sidewalls 175S of the corresponding conductive layer 175, and each of the barrier layers 173 has a second thickness T2 under the bottom surface 175B of the corresponding conductive layer 175. In some embodiments, the barrier layers 173 are formed by an anisotropic deposition process so that the first thickness is less than the second thickness. In some embodiments, the anisotropic deposition process for forming the barrier layers 173 includes a physical vapor deposition (PVD) process. In some embodiments, the semiconductor device 100C is part of a DRAM.

FIGS. 21, 22A, 22B, 22C, 22D, 22E, 22F, 22G are cross-sectional views illustrating an intermediate stage during the formation of the semiconductor device **100*d*, in accordance with some embodiments. FIG. 21 illustrates the intermediate stage after the capacitor contacts 143 and the air structures 213 (i.e., the first spacer structures 137) are formed. FIGS. 22A, 22B, 22C, 22D, 22E, 22F, 22G are cross-sectional views illustrating an intermediate stage of forming the capacitor contact 143 during the formation of the semiconductor device 100*d*. As shown in FIG. 21, in some other embodiments, each of the first spacer structure 137 of the semiconductor device 100*d* is a single layer structure, and each of the capacitor contacts 143 is a composite structure. Some materials and processes used to form the semiconductor device 100*d* are similar to, or the same as those used to form the semiconductor device 100*a***, and details thereof are not repeated herein.

Figure 22A:
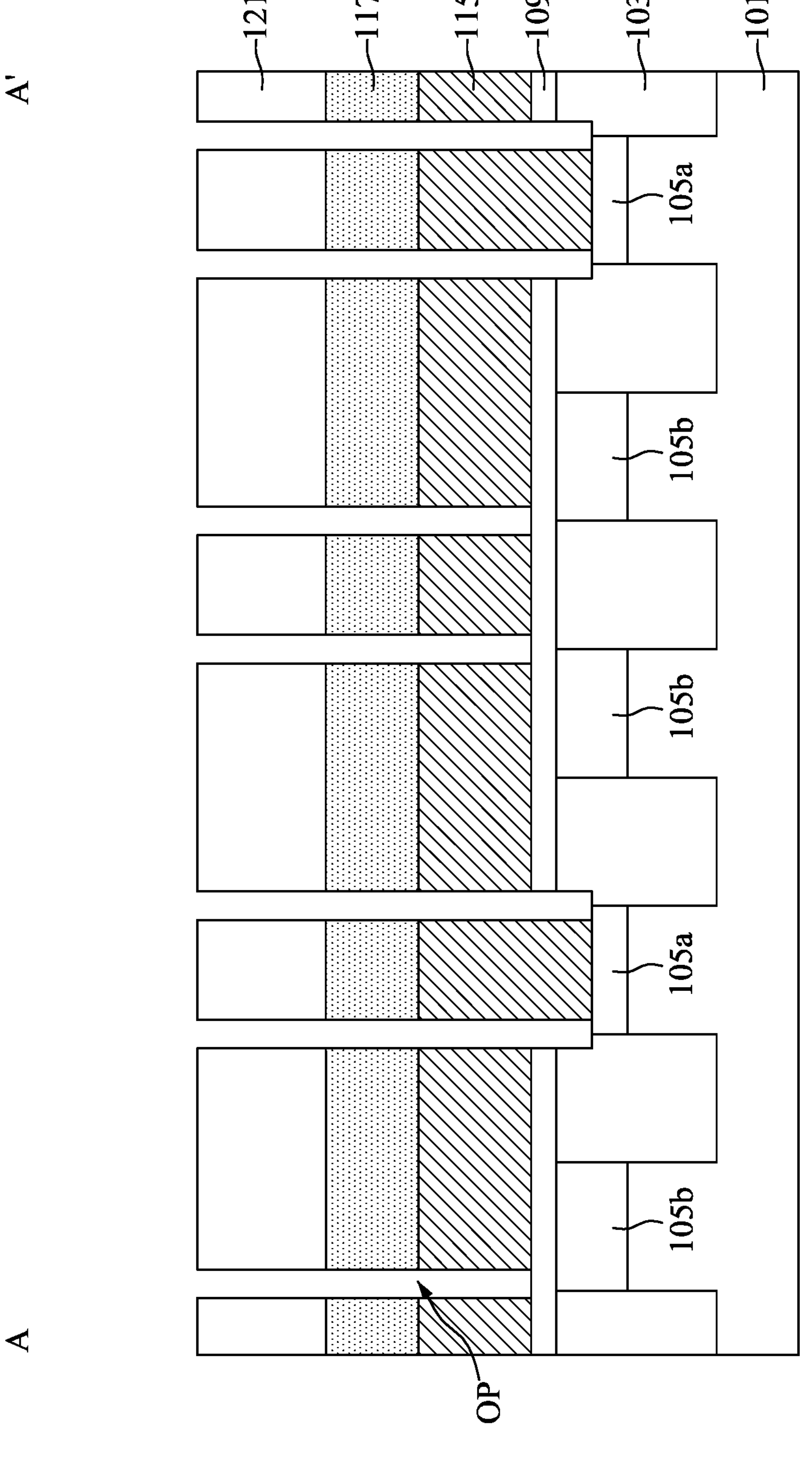
FIG. 22A, 22B, 22C, 22D, 22E, 22F, 22G is a cross-sectional view illustrating an intermediate stage during the formation of the semiconductor device, in accordance with some embodiments.
Figure 22B:
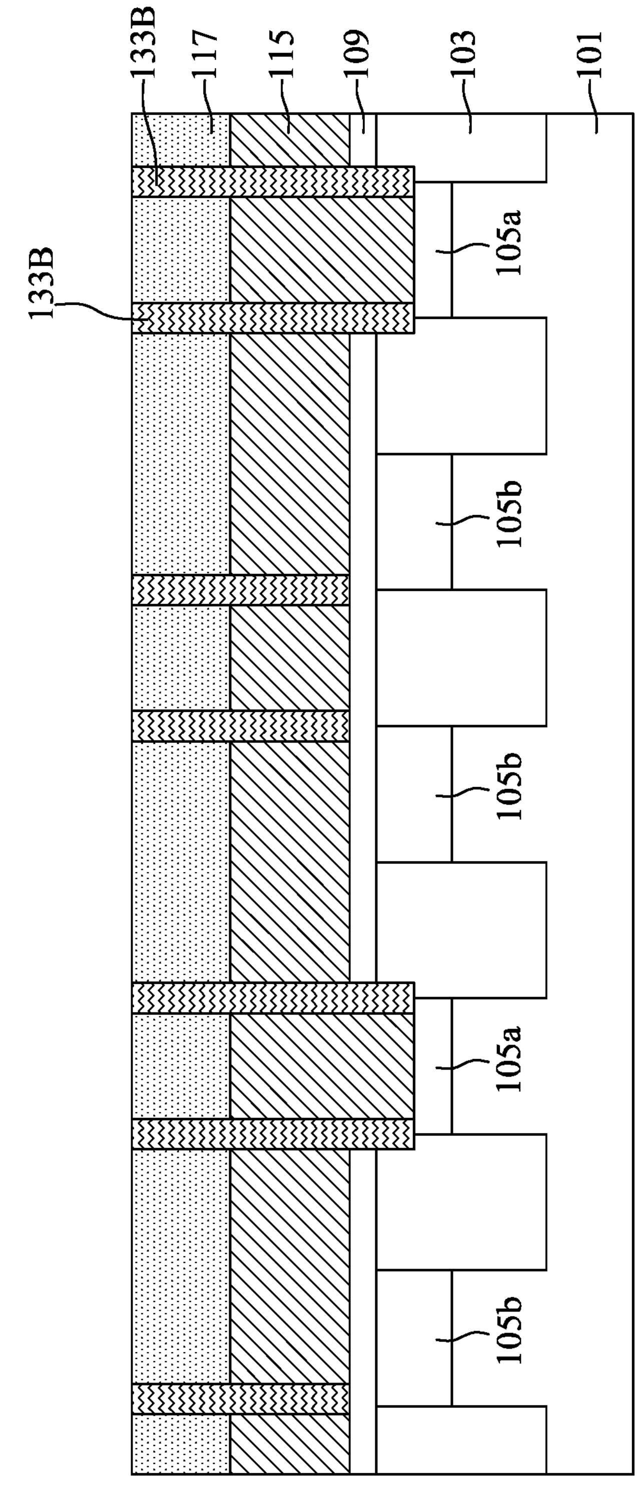

At step S13, as shown in FIGS. 22A and 22B, lower portions 133B of the first spacer structure 137 are formed alongside the bit line structures 119, in accordance with some embodiments. The formation of the lower portions 133B of the first spacer structure 137 may include forming a patterned mask 121-1 over the metal layer 117, etching the metal layer 117, the semiconductor layer 115 by using the patterned mask 121-1 as a mask and thus forming openings OP after the patterned mask 121-1 is removed, as shown in FIG. 22A. Then depositing an energy removable material in the opening OP and over the metal layer 117, and planarizing the energy removable material until the metal layer 117 is exposed, as shown in FIG. 22B in accordance with some embodiments.

Figure 22C:
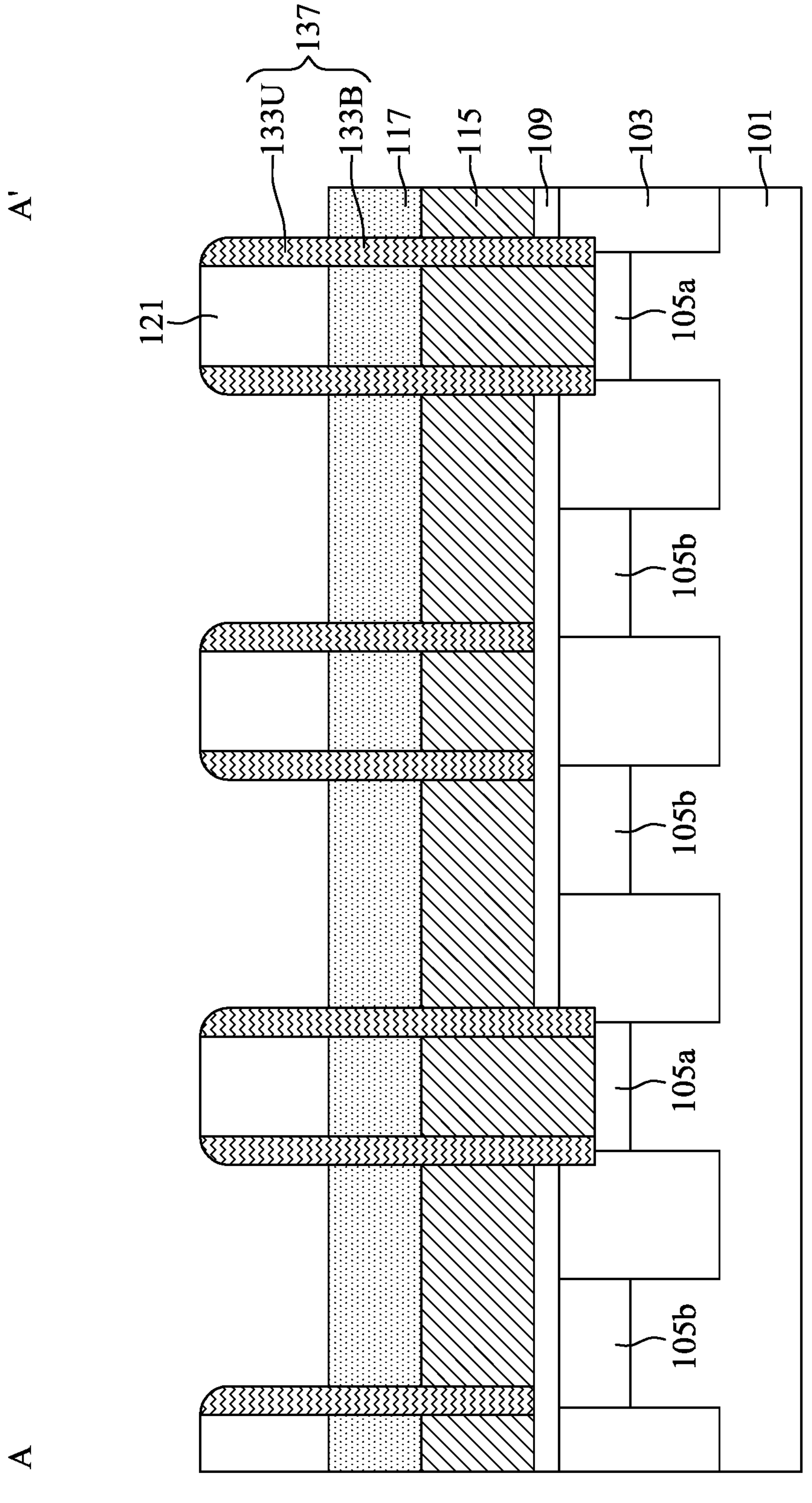

At step S15, as shown in FIG. 22C, a patterned mask 121 and upper portions 133 of the first spacer structures 137 are formed. The formation of the patterned mask 121 and the upper portions 133U of the first spacer structures 137 are similar to those used to form the patterned mask 121 and the middle spacers 133 of the semiconductor device **100*a***, and details thereof are not repeated herein.

Figure 22D:
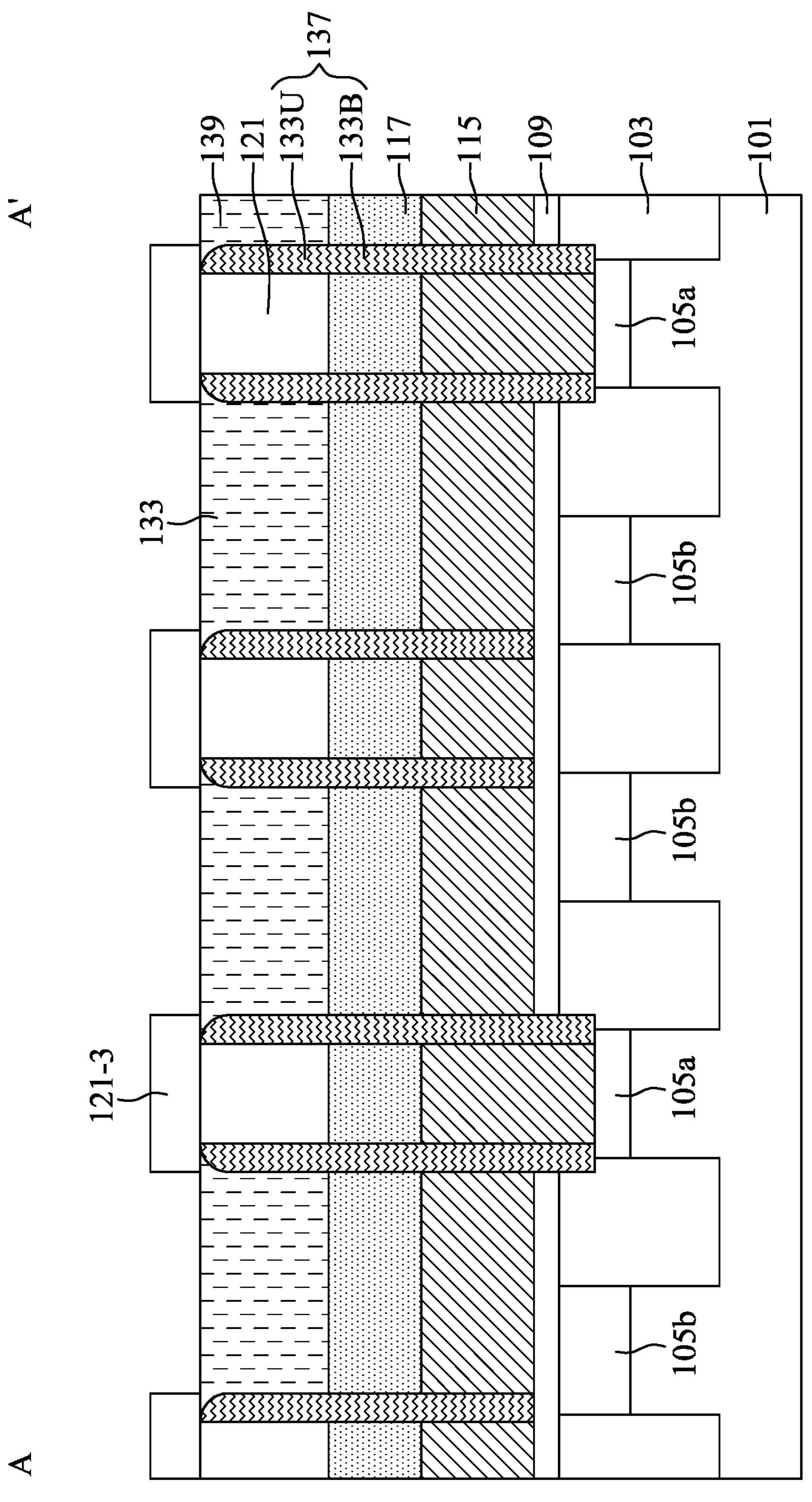

Then, a dielectric layer 139 is formed to fill the space between the upper portions 133U of the first spacer structures 137 and over the metal layer 117, shown in FIG. 22D in accordance with some embodiments. The dielectric layer 139 may be made of a low-k dielectric material. In some embodiments, the low-k dielectric material has a dielectric constant (k value) less than about 4. Examples of the low-k dielectric material include, but not limited to, silicon oxide, silicon nitride, silicon oxynitride (SiON), silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. The dielectric layer 139 may be formed by a deposition process. After the dielectric layer 139 is deposited, a planarization process may be performed until the patterned mask 121 is exposed. The planarization process may be a chemical mechanical polishing (CMP) process.

Figure 22E:
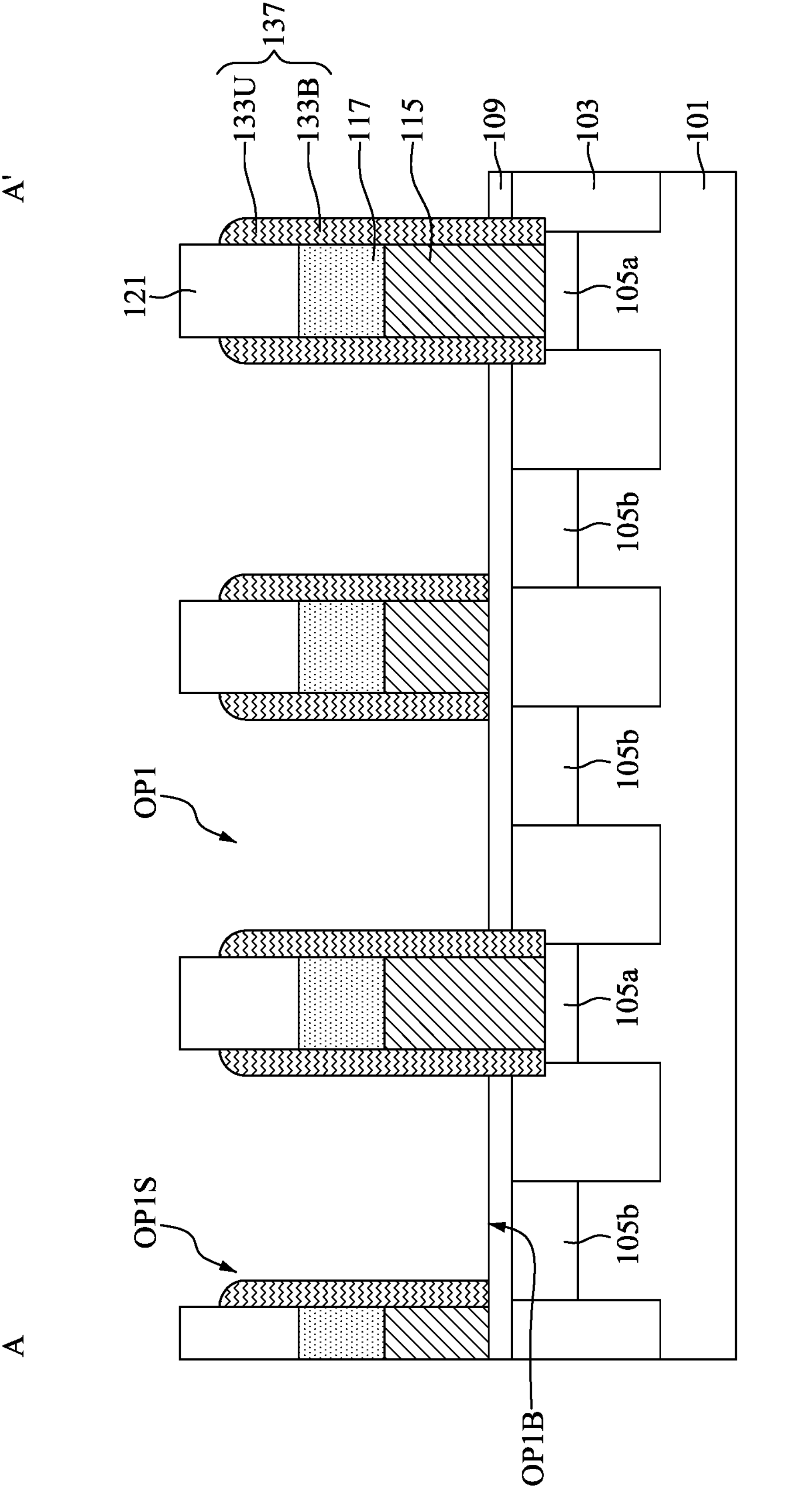

Next, openings OP1 are formed penetrating through the dielectric layer 139, the metal layer 117, the semiconductor layer 115 and the barrier layer 109 such that the source/drain regions 105*b* are exposed. The formation of the openings include forming a patterned mask 121-3, etching the dielectric layer 139, the metal layer 117, the semiconductor layer 115 and the barrier layer 109. In some embodiments, the openings OP1 exposing source/drain regions 105*b* are formed by a dry etching process. Then, after the openings OP1 are formed and the patterned mask 121-3 is removed, the first spacer structures 137 are formed, as shown in FIG. 22E in accordance with some embodiments.

Figure 22F:
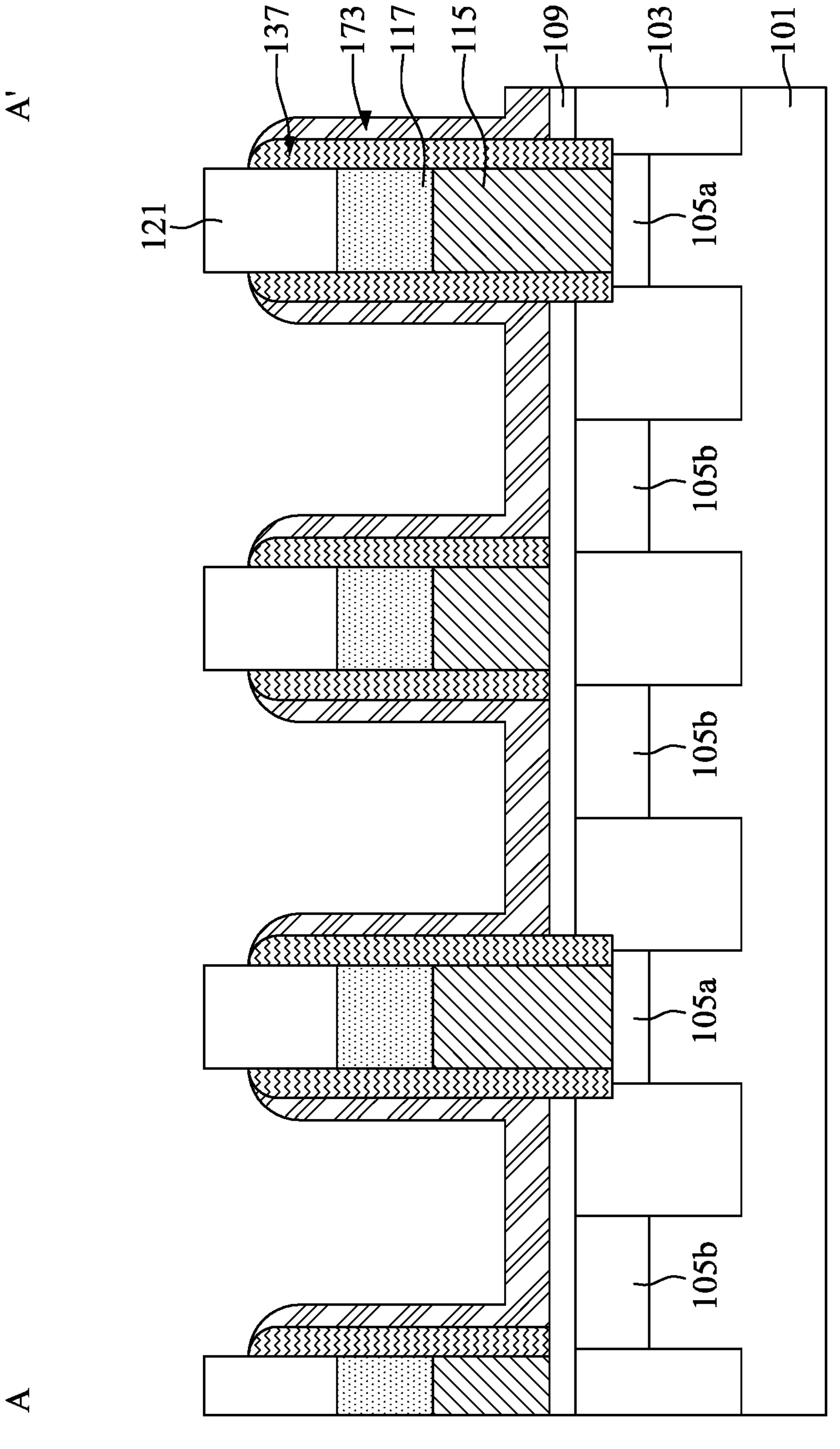

At step S17, as shown in FIG. 22F, a barrier layer 173 is formed covering the sidewalls and bottom surfaces of the openings OP1, as shown in FIG. 22F in accordance with some embodiments. In some embodiments, the barrier layers 173 include titanium (Ti), titanium nitride (TiN), or a combination thereof. In some embodiments, an anisotropic deposition process is performed to form barrier layers 173.

Figure 22G:
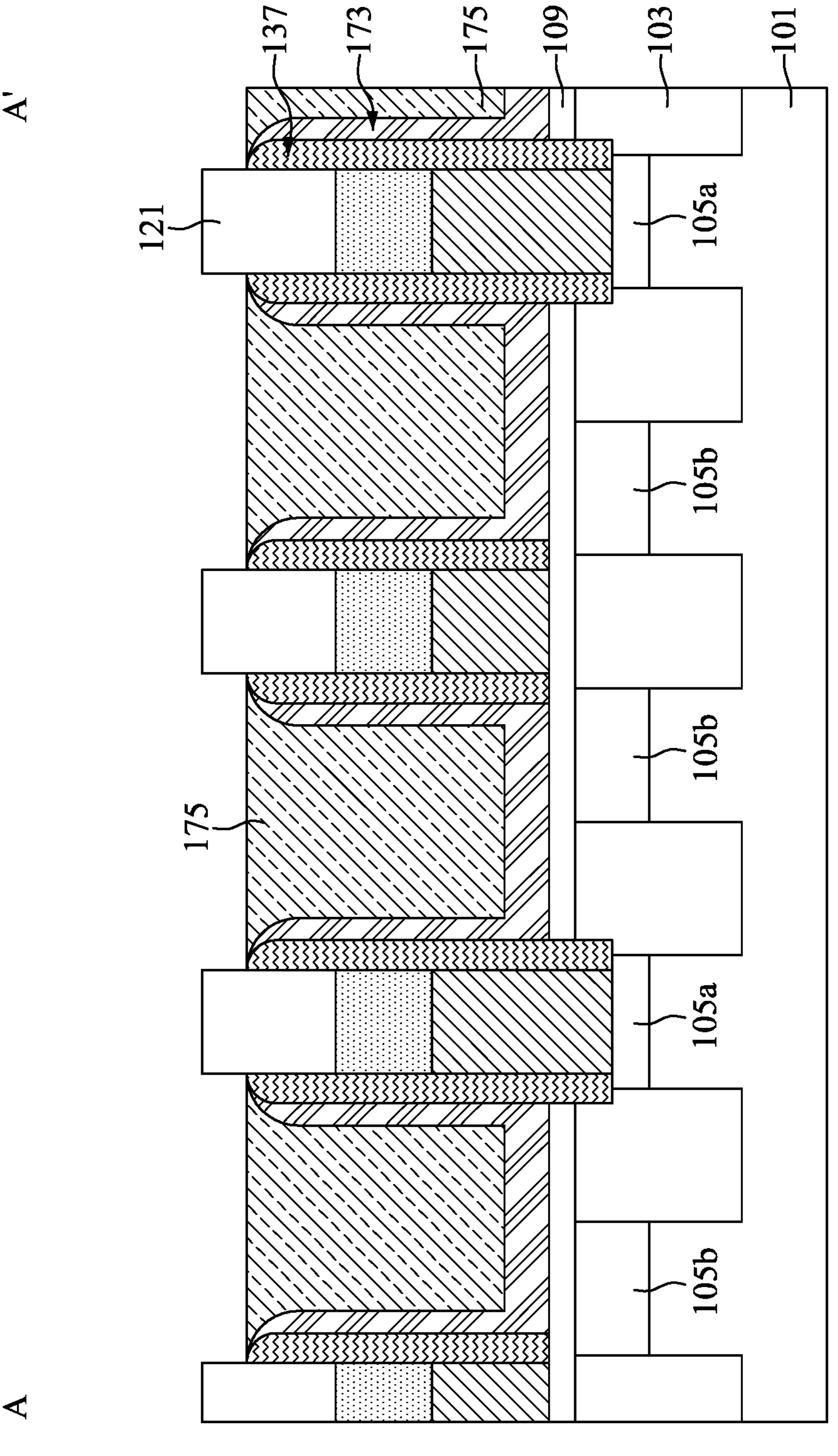

Then, conductive layers 175 are form over the barrier layers 173 and fill the openings OP1, as shown in FIG. 22G in accordance with some embodiments. In some embodiments, the conductive layers 175 include tungsten (W). In some embodiments, the conductive layers 175 are formed by a deposition process. After the conductor layers 175 are formed, a subsequent etch-back process is performed and the capacitor contacts 143 having composite contacts 179 are obtained.

At step S23, a heat treatment process is performed to transform portions of the first spacer structures 137 into air gap structures 213 including an air gap 211C enclosed by a liner 211B (as shown in FIG. 21). After the air gap structures 213 are formed, the semiconductor device 100*d* are obtained. In some embodiments, the semiconductor device 100*d* is part of a DRAM.

Embodiments of a semiconductor device and method for forming the same are provided in the disclosure. The method includes forming a first spacer structure on a sidewall of a bit line structure, and forming a capacitor contact adjacent to the first spacer structure. In some embodiments, the method also includes forming a second spacer structure over the first spacer structure and performing a heat treatment process to transform a portion of the first spacer structure (e.g., the middle spacer 133) into an air gap. Therefore, the parasitic capacitance between the bit line structure and the capacitor contact may be reduced, and the remaining portions of the first spacer structure (e.g., the inner spacer 131 and the outer spacer 135) may provide additional structural support to the semiconductor device. Moreover, the second spacer structure may prevent undesirable short circuit between the bit line structure and the subsequently formed conductive pad over the capacitor contact. As a result, the overall device performance may be improved, and the yield rate of the semiconductor device may be increased.

In one embodiment of the present disclosure, a method for forming a semiconductor device is provided. The method includes forming a first source/drain region and a second source/drain region in a semiconductor substrate and forming a bit line structure over and electrically connected to the first source/drain region. The method also includes forming a first spacer structure on a sidewall of the bit line structure, and forming a capacitor contact over and electrically connected to the second source/drain region. The capacitor contact is adjacent to the first spacer structure, and the first spacer structure is etched during the forming the capacitor contact. The method further includes forming a second spacer structure over the etched first spacer structure, and performing a heat treatment process to transform a portion of the first spacer structure into an air gap after the second spacer structure is formed.

In another embodiment of the present disclosure, a method for forming a semiconductor device is provided. The method includes forming a first source/drain region and a second source/drain region in a semiconductor substrate and forming a semiconductor layer over the semiconductor substrate. The method also includes forming a metal layer over the semiconductor layer and forming a patterned mask over the metal layer. The method further includes etching the semiconductor layer and the metal layer to form a bit line structure using the patterned mask as a mask. The bit line structure is formed over and electrically connected to the first source/drain region. In addition, the method includes forming a first spacer structure on a sidewall of the bit line structure and a sidewall of the patterned mask, and forming a capacitor contact over and electrically connected to the second source/drain region, wherein the first spacer structure is sandwiched between the bit line structure and the capacitor contact. The method also includes forming a second spacer structure over the first spacer structure, and performing a heat treatment process to form an air gap in the first spacer structure after the second spacer structure is formed.

In yet another embodiment of the present disclosure, a semiconductor device is provided. The semiconductor device includes a first source/drain region and a second source/drain region disposed in a semiconductor substrate, and a bit line structure disposed over and electrically connected to the first source/drain region. The semiconductor device also includes a capacitor contact disposed over and electrically connected to the second source/drain region, and a first spacer structure sandwiched between the bit line structure and the capacitor contact. The first spacer structure includes an air gap. The semiconductor device further includes a second spacer structure disposed over the first spacer structure. The air gap is covered by the second spacer structure.

The embodiments of the present disclosure have some advantageous features. By performing a heat treatment process to transform a portion of the first spacer structure into an air gap, the parasitic capacitance between the conductive features on opposite sides of the first spacer structure may be reduced, and the remaining portions of the first spacer structure may provide additional structural support to the semiconductor device. Moreover, by forming the second spacer structure over the first spacer structure, undesirable short circuit may be prevented. As a result, the overall device performance may be improved, and the yield rate of the semiconductor device may be increased.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing an air gap between bit line structure and capacitor contact, comprising:

defining a plurality of active regions by forming a device isolation layer in a substrate;

forming a semiconductor layer and a metal layer on the active regions;

forming a first mask intersecting the active regions on the metal layer;

etching the semiconductor layer and the metal layer using the first mask as etch mask to form a plurality of bit line structures;

forming a plurality of lower spacer structures with an energy removable material on sidewalls of the plurality of bit line structures;

forming a second mask over the metal layer;

forming a plurality of upper spacer structures over the plurality of lower spacer structures;

forming a dielectric layer surrounding the upper spacer structures and covering the metal layer;

forming a plurality of capacitor contacts including a barrier layer and a conductor layer;

performing a thermal treating process to transform the plurality of first spacer structures into a plurality of air gap structures;

wherein the barrier layer is formed by an anisotropic deposition process.

2. The method of claim 1, wherein forming the lower spacer structures with an energy removable material comprising:

depositing the energy removable material over the metal layer; and planarizing the energy removable material until the metal layer is exposed.

3. The method of claim 1, wherein forming the lower spacer structures comprising:

conformally depositing the energy removable material overlying the first mask and the metal layer; and etching the energy removable material by an anisotropic etching process.

4. The method of claim 1, wherein forming the dielectric layer surrounding the upper spacer structures and covering the metal layer comprising:

depositing a dielectric material overlying and covering the upper spacer structures and the metal layer; and planarizing the dielectric material until the first mask is exposed.

5. The method of claim 1, wherein the conductive layer is formed by a deposition process.

6. The method of claim 5, wherein the barrier layer has a first thickness on the sidewall of the corresponding conductive layer and a second thickness under the bottom surface of the corresponding conductive layer.

7. The method of claim 1, wherein performing a thermal treating process forms the air gap enclosed by a liner.

8. A method for manufacturing a semiconductor device, comprising:

forming a first source/drain region and a second source/drain region in a semiconductor substrate;

forming a bit line structure over and electrically connected to the first source/drain region;

forming a capacitor contact over and electrically connected to the second source/drain region;

forming a first spacer structure between the bit line structure and the capacitor contact, wherein the first spacer structure comprises an air gap; and forming a second spacer structure over the first spacer structure, wherein the air gap is covered by the second spacer structure;

wherein the capacitor contact comprises a barrier layer and a conductive layer lining the barrier layer;

wherein the barrier layer has a first thickness on the sidewall of the corresponding conductive layer and a second thickness under the bottom surface of the corresponding conductive layer.

9. The method of claim 8, wherein the formation of the bit line structure comprising:

forming a semiconductor layer over the semiconductor substrate;

forming a metal layer over the semiconductor layer; and performing an etching process on the semiconductor layer and the metal layer.

10. The method of claim 8, further forming a patterned mask over the bit line structure.

11. The method of claim 10, further forming a dielectric layer over the second spacer structures and the patterned mask.

12. The method of claim 11, further forming a conductive pad covering the second spacer structure and covering portions of the patterned mask.

13. The method of claim 12, wherein the conductive pad is disposed over and electrically connected to the capacitor contact.

14. The method of claim 8, further performing a thermal treating process to transform the first spacer structure into an air gap structure, wherein the air gap structure including the air gap enclosed by a liner.

15. The method of claim 14, wherein the air gap structure and the air gap extend into the semiconductor substrate.

* * * * *